United States Patent
Yonemura et al.

(10) Patent No.: US 12,037,673 B2
(45) Date of Patent: Jul. 16, 2024

(54) METAL MASK MATERIAL, METHOD FOR MANUFACTURING SAME, AND METAL MASK

(71) Applicant: NIPPON STEEL Chemical & Material Co., Ltd., Tokyo (JP)

(72) Inventors: Mitsuharu Yonemura, Tokyo (JP); Naoki Fujimoto, Tokyo (JP); Keita Kimura, Tokyo (JP); Hiroto Unno, Tokyo (JP)

(73) Assignee: NIPPON STEEL CHEMICAL & MATERIAL CO., LTD., Tokyo (JP)

( * ) Notice: Subject to any disclaimer, the term of this patent is extended or adjusted under 35 U.S.C. 154(b) by 616 days.

(21) Appl. No.: 17/280,765

(22) PCT Filed: Sep. 27, 2019

(86) PCT No.: PCT/JP2019/038416
§ 371 (c)(1),
(2) Date: Jun. 21, 2021

(87) PCT Pub. No.: WO2020/067537
PCT Pub. Date: Apr. 2, 2020

(65) Prior Publication Data
US 2021/0340664 A1    Nov. 4, 2021

(30) Foreign Application Priority Data

Sep. 27, 2018 (JP) .................................. 2018-182992
Sep. 27, 2018 (JP) .................................. 2018-182993
(Continued)

(51) Int. Cl.
*C23C 14/04*       (2006.01)
*C21D 8/02*        (2006.01)
(Continued)

(52) U.S. Cl.
CPC .......... *C23C 14/042* (2013.01); *C21D 8/0205* (2013.01); *C21D 8/0226* (2013.01);
(Continued)

(58) Field of Classification Search
USPC .......................... 118/504, 505, 721; 427/282
See application file for complete search history.

(56) References Cited

U.S. PATENT DOCUMENTS 6,130,500 A *  10/2000  Park ...................... H01J 9/146
                                                     445/47
6,285,120 B1 *  9/2001  Park ...................... H01J 29/07
                                                     313/402

(Continued)

FOREIGN PATENT DOCUMENTS

EP    1979501 B1 *  3/2010 ............. C21D 6/001
JP    5-214492 A     8/1993
(Continued)

OTHER PUBLICATIONS

English Translation JP 2010214447A (Year: 2010).*
(Continued)

*Primary Examiner* — Yewebdar T Tadesse
(74) *Attorney, Agent, or Firm* — Birch, Stewart, Kolasch & Birch, LLP

(57) ABSTRACT

A metal mask material for OLED use reduced in amount warpage due to etching, a method for manufacturing the same, and a metal mask are provided. The metal mask material and metal mask of the present invention contain, by mass %, Ni: 35.0 to 37.0% and Co: 0.00 to 0.50%, have a balance of Fe and impurities, have thicknesses of 5.00 μm or more and 50.00 μm or less, and have amounts of warpage defined as maximum values in amounts of rise of four corners of a square shaped sample of the metal mask material of 100 mm sides when etching the sample from one
(Continued)

surface until the thickness of the sample becomes ⅖ and placing the etched sample on a surface plate of 5.0 mm or less.

14 Claims, 19 Drawing Sheets

(30) Foreign Application Priority Data

| Sep. 27, 2018 | (JP) | 2018-183001 |
| Sep. 27, 2018 | (JP) | 2018-183002 |
| Sep. 27, 2018 | (JP) | 2018-183006 |
| Sep. 27, 2018 | (JP) | 2018-183007 |

(51) Int. Cl.
| *C21D 9/46* | (2006.01) |
| *C22C 38/00* | (2006.01) |
| *C22C 38/02* | (2006.01) |
| *C22C 38/04* | (2006.01) |
| *C22C 38/06* | (2006.01) |
| *C22C 38/10* | (2006.01) |
| *C23C 16/04* | (2006.01) |
| *C23F 1/02* | (2006.01) |

(52) U.S. Cl.
CPC ......... *C21D 8/0236* (2013.01); *C21D 8/0268* (2013.01); *C21D 9/46* (2013.01); *C22C 38/002* (2013.01); *C22C 38/02* (2013.01); *C22C 38/04* (2013.01); *C22C 38/06* (2013.01); *C22C 38/105* (2013.01); *C23C 16/042* (2013.01); *C23F 1/02* (2013.01)

(56) References Cited

U.S. PATENT DOCUMENTS

| 2016/0237546 A1 | 8/2016 | Ikenaga et al. |
| 2017/0287727 A1* | 10/2017 | Kikuchi ............ H01L 21/31144 |
| 2020/0095668 A1* | 3/2020 | Kanda .................... H05B 33/10 |

FOREIGN PATENT DOCUMENTS

| JP | 7-62495 A | 3/1995 |
| JP | 2003-27188 A | 1/2003 |
| JP | 2004-115905 A | 4/2004 |
| JP | 2004-183023 A | 7/2004 |
| JP | 2010214447 A * | 9/2010 ............... C21D 8/02 |
| JP | 2014-101543 A | 6/2014 |
| JP | 2015-78401 A | 4/2015 |
| JP | 2017-88915 A | 5/2017 |
| WO | WO 00/70108 A1 | 11/2000 |
| WO | WO 2018/043641 A1 | 3/2018 |

OTHER PUBLICATIONS

English Translation EP 1979501 B1 (Year: 2010).*
"Handbook of Iron and Steel, Fifth Edition, The 4th Volume Analysis and Testing." Chapter 4, 1.4.7. X-Ray Diffraction Analysis, ISBN:9784930980830, Aug. 31, 2014, pp. 76-83 (total 9 pages).
Ono et al., "Thermal Expansion Measu in Fe-Base Invar Alloys," Physica B+C, vol. 119B, Issue 1, 1983, p. 78-83.
The Society of Material Science Japan, "Standard for X-Ray Stress Measurement." Iron and Steel, 2002, p. 42-43 (total 3 pages).

* cited by examiner

FIG. 6
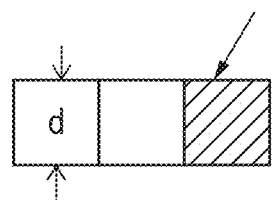 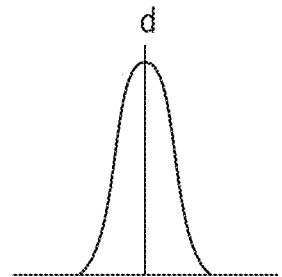
(a) NO STRAIN
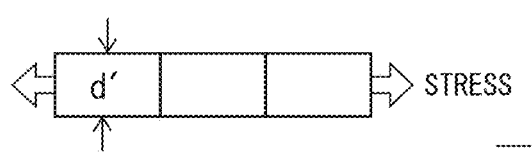 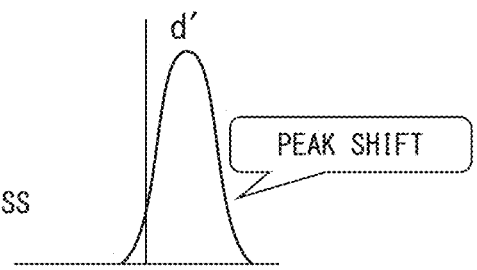
(b) UNIFORM STRAIN
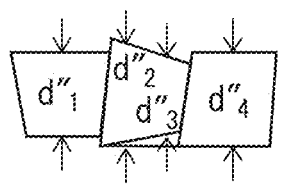 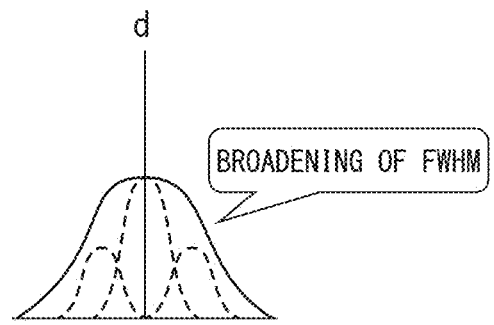
(c) NON-UNIFORM STRAIN
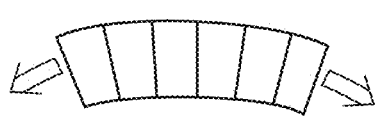 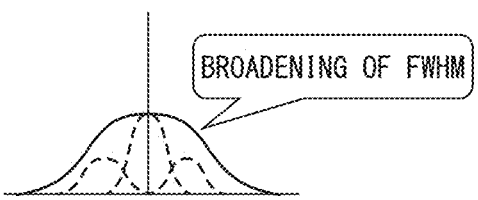
$2\theta \longrightarrow$
(d) NON-UNIFORM STRAIN FIG. 8
(A)
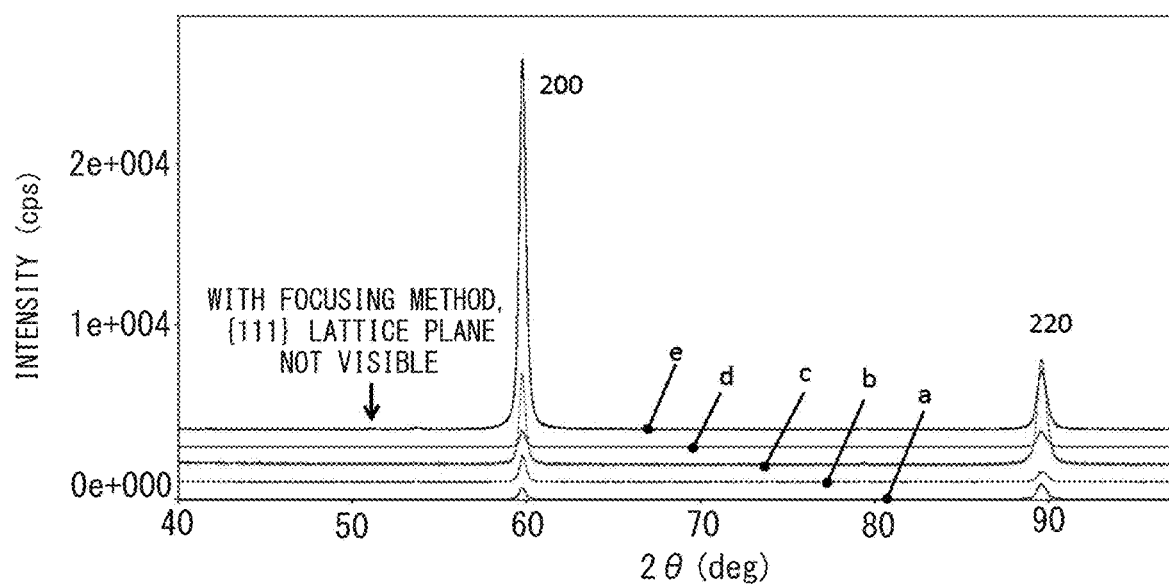
(B)
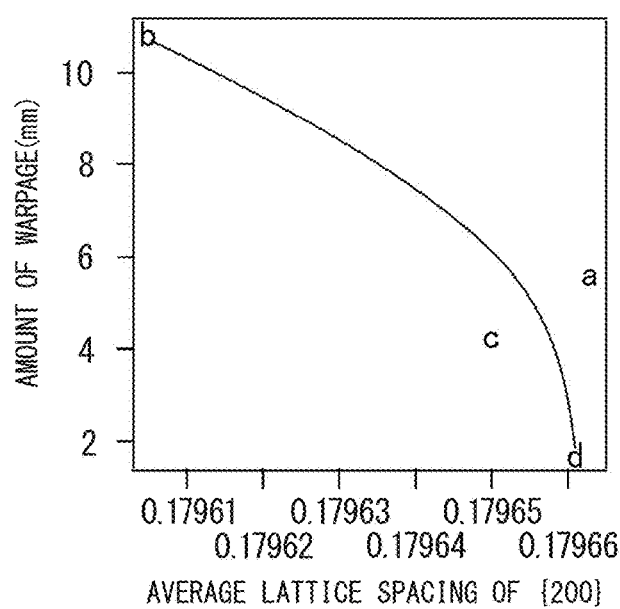

FIG. 12-2
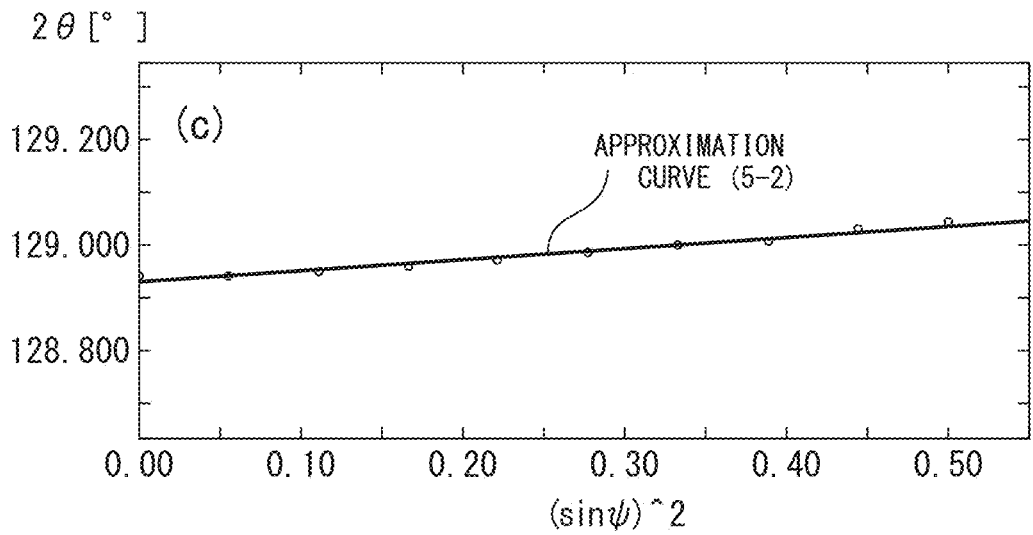
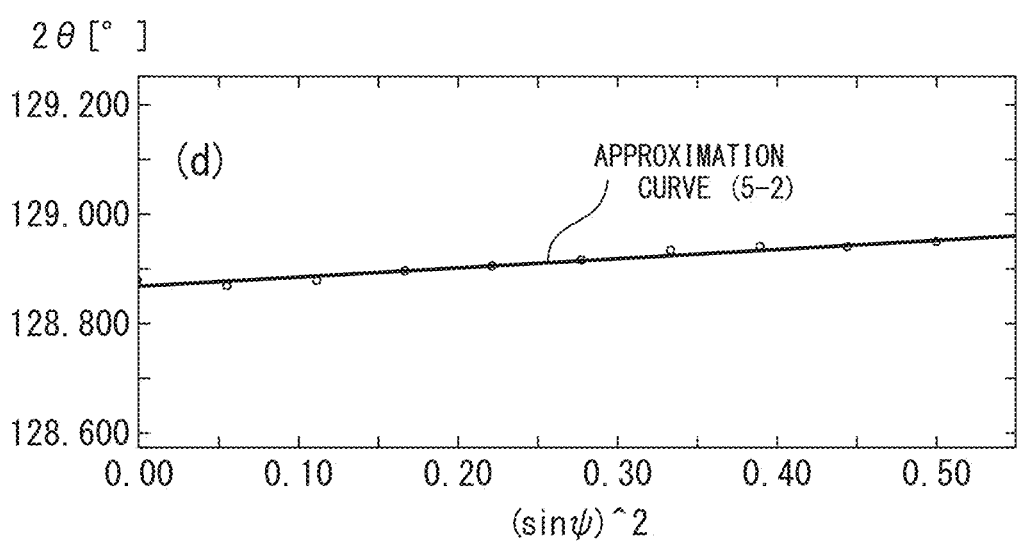
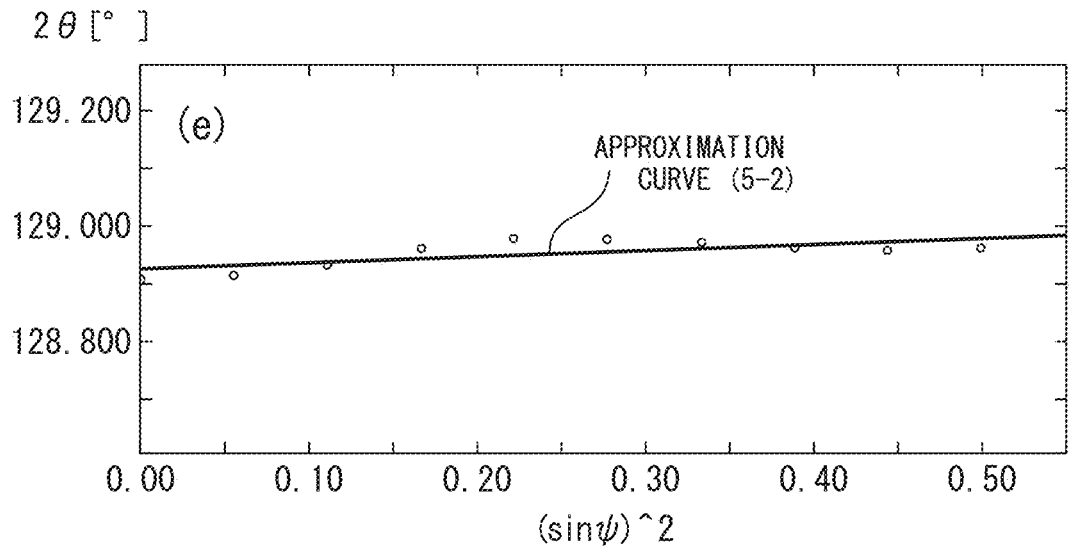

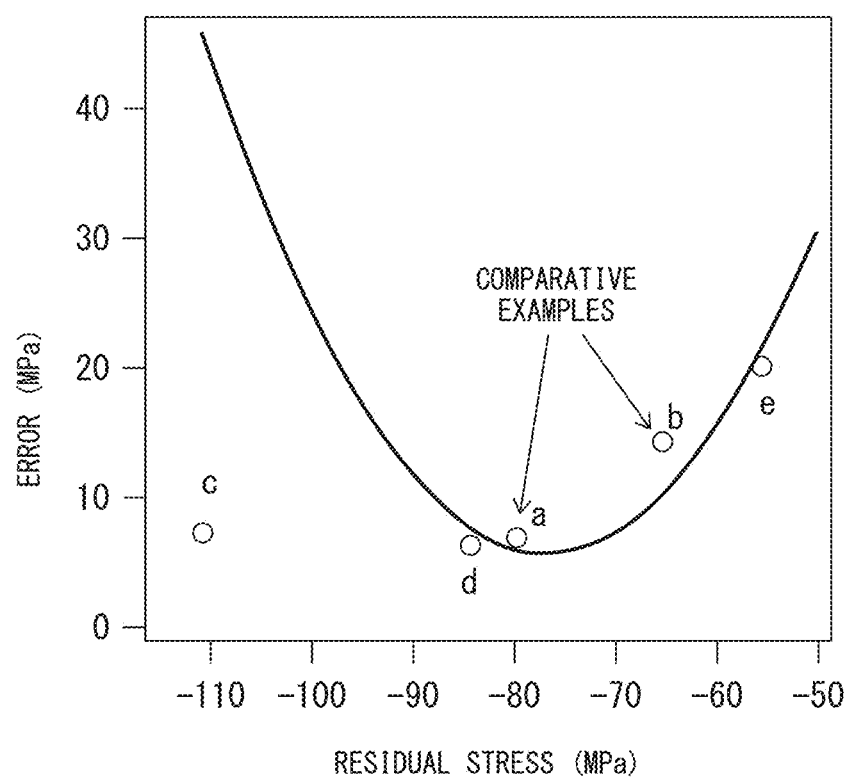

FIG. 14-2
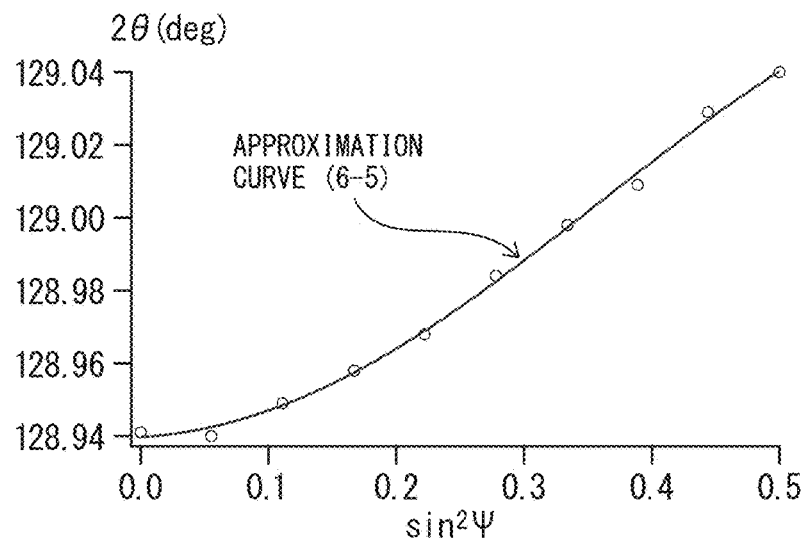
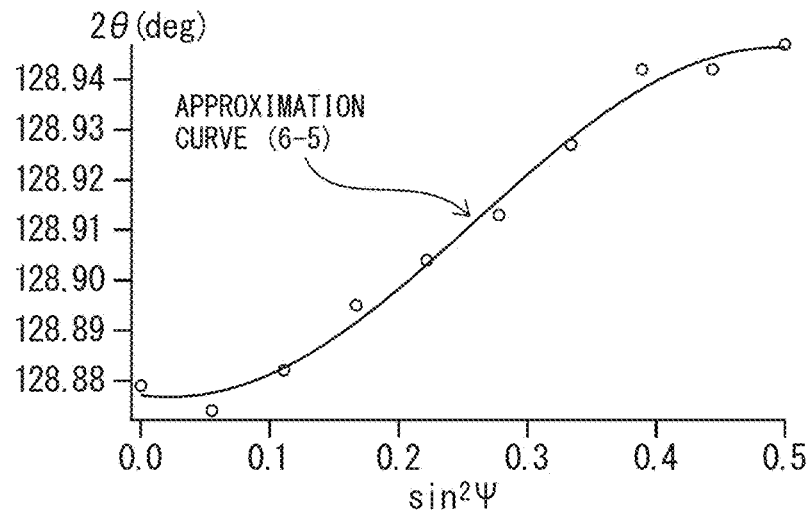
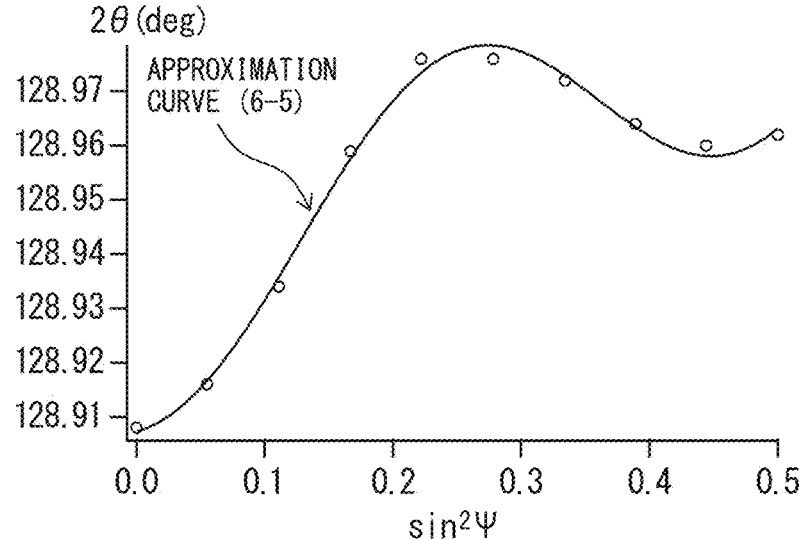

METAL MASK MATERIAL, METHOD FOR MANUFACTURING SAME, AND METAL MASK

FIELD

The present invention relates to a metal mask material and to a metal mask used for manufacturing an organic EL display (OLED) etc.

BACKGROUND

When making an OLED display color using the additive color model individually patterning RGB elements, a metal mask is used for each of RGB to mask the electrode openings of the other colors during vapor deposition. That is, a metal mask for OLED use is fastened in a state applying tension so that there is no looseness or slack in the window frame-shaped frame. As shown in FIG. 18, an organic EL luminescent material 3a is deposited from the mask holes 1a onto a glass substrate or film substrate or other substrate 2.

A metal mask is provided with a plurality of mask parts formed with mask holes in a 1:1 correspondence with the RGB of the pixels of the OLEDs and having sizes of the same extent as the sizes of the OLEDs at equal intervals. Since the metal mask must be formed with mask holes in a 1:1 correspondence with the RGB of the pixels of the OLEDs manufactured, so the pitch intervals of the mask holes 1a become at least the same extents as the pixel densities of the OLEDs. The sizes of the mask holes 1a also are made finer along with this.

When making an organic EL luminescent material 3a pass through the mask holes 1a to make it deposit on the substrate 2, depending on the thickness of the metal mask, sometimes deposition of the organic EL luminescent material 3a on the substrate 2 will be obstructed and part of the subpixels forming the RGB will end up being formed thinner than the desired thicknesses. To prevent such a "shadowing" effect, a metal sheet having a thickness of the same extent as the pitch intervals is used for the metal mask 1. Further, as shown in FIG. 18, the metal mask 1 is manufactured by etching away about 30 to 70% of the thickness of the metal sheet from one surface (below, referred to as "half etching") so that the mask holes 1a have cross-sectional shapes increasing in size from the substrate 2 side toward the vapor deposition source 3 side of the organic EL luminescent material 3a.

To manufacture such a metal mask, it is proposed to use an Invar alloy like in PTLs 1 and 2. An Invar alloy does not change in dimensions due to temperature, so it has been used since the past, as shown in PTLs 3 to 5, so as to manufacture shadow masks for CRTs for color televisions or CRTs for computer monitors.

However, when half etching a metal mask material comprised of an Invar alloy, sometimes deformation occurs where the edge sides warp up so that the center part of the metal mask material becomes recessed (below, referred to as "warpage after etching"). Due to such warpage after etching, the precision of alignment with the substrate 2 is lost and positional deviation occurs between the pixel patterns on the substrate 2 and the patterns of the metal mask 1, so the problem arises that it is not possible to finely pattern the organic compound layers of organic EL elements.

Warpage of the metal mask material is due to the residual stress of the metal mask material. PTL 6 discloses a method of manufacture including a process of using an annealing process to remove internal stress of a metal sheet and etching a sample cut out from the metal sheet after the annealing process to inspect whether a rate of curvature "k" of the warpage is 0.008 mm$^{-1}$ or less. However, the inspection process is just a process of selecting a long metal sheet for obtaining a vapor deposition mask having excellent vapor deposition properties from among a plurality of long metal sheets manufactured. PTL 5 does not disclose identifying the metal microstructure of the long metal sheet. For this reason, in the method of manufacture disclosed in PTL 6, it is difficult to identify the manufacturing conditions for controlling the residual stress of a metal sheet to a suitable range before manufacture of a long metal sheet.

Further, when residual stress is removed by heat treatment, the shape of the material which was held by the residual stress changes so that the strain is eliminated, so the dimensions of the metal sheet sometimes become smaller. If the dimensions of the metal sheet forming the vapor deposition mask change due to heat, there is the technical issue that the positions of via holes formed in the vapor deposition mask also change. PTL 7 discloses dealing with this technical issue by a method of manufacture including an inspection process inspecting an extent of thermal restoration before and after heat treating a sample cut out from a long metal sheet manufactured. However, the inspection process disclosed in PTL 7 is based on use of a long metal sheet forming the base of the vapor deposition mask which is small in extent and variation of residual strain. A method of identifying the metal microstructure of the long metal sheet is not disclosed. For this reason, in the method of manufacture disclosed in PTL 7, it is difficult to identify the manufacturing conditions for controlling the residual stress of a metal sheet to a suitable range before manufacture of the long metal sheet.

PTL, 8 discloses, considering the difference in the etching rates due to the crystal orientation, a metal mask material comprised of an Fe—Ni alloy with X-ray diffraction intensities of the main crystal orientations (111), (200), (220), (311) of the rolled surface satisfying a certain relationship. The metal mask material disclosed in PTL 8 is not strongly oriented in only a specific orientation, so can be uniformly and precisely etched. In PTL 8, it is disclosed that the degrees of crystal orientation of (200), (220), (311) of the metal mask material are greatly affected by a cold rolling workability before a final recrystallization annealing, a grain size number of the final recrystallization annealing, and workability of the final cold rolling. However, as explained later, a distribution arises in the strain in the thickness direction due to non-uniformity of lattice spacing in the thickness direction from the surface. The metal mask material disclosed in PTL 8 is not intentionally controlled in non-uniformity of lattice spacing, so the distribution of lattice strain in the thickness direction is not necessarily sufficiently controlled. For this reason, deformation of the metal mask material due to etching cannot be reliably reduced.

PTL 9 discloses a metal mask material with an amount of warpage of 15 mm or less and a thickness of 0.01 mm or more and less than 0.10 mm when cutting out a sample of a length of 150 mm and a width of 30 mm and etching the sample from one side to remove 60% of the thickness of the sample. However, PTL does not disclose reducing the amount of warpage from the viewpoint of the microstructure of the metal mask.

CITATIONS LIST

Patent Literature

[PTL 1] Japanese Unexamined Patent Publication No, 2004-183023
[PTL 2] Japanese Unexamined Patent Publication No, 2017-88915
[PTL 3] WO00/70108
[PTL 4] Japanese Unexamined Patent Publication No. 2003-27188
[PTL 5] Japanese Unexamined Patent Publication No. 2004-115905
[PTL 6] Japanese Unexamined Patent Publication No, 2014-101543
[PTL 7] Japanese Unexamined Patent Publication No. 2015-78401
[PTL 8] Japanese Unexamined Patent Publication No. 2014-101543
[PTL 9] WO2018/043641

Nonpatent Literature

[NPL 1] Ono, F.; Kittaka, T.; Maeta, H., Physica B+C, Volume 119, Issue 1, p. 78-83
[NPL 2] Fifth Edition Iron and Steel Handbook, Chapter 4, 1.4.7. X-Ray Diffraction Analysis
[NPL 3] Standard for X-Ray Stress Measurement (2002), Iron and Steel, p. 81, the Society of Material Sciences Japan

SUMMARY

Technical Problem

The present invention was made in consideration of such a problem and has as its technical problem to provide a metal mask material for OLED use reduced in amount of warpage and a method for manufacturing the same and a metal mask.

Solution to Problem

The gist of the present invention for solving the above technical problem is as follows:

(1) A metal mask material containing, by mass %, Ni: 35.0 to 37.0% and Co: 0.00 to 0.50% and having a balance of Fe and impurities and
having a thickness of 5.00 μm or more and 50.00 μm or less,
in which metal mask material,
when etching a sample of the metal mask material of a square shape of 10 mm sides from one surface until the thickness of the sample becomes ⅖ and placing the etched sample on a surface plate, an amount of warpage, as defined by a maximum value in amounts by which four corners of the sample were lifted up, is 5.0 mm or less.
(2) The metal mask material according to (1) further containing, by mass %, C: 0.05% or less and Ca: 0.0005% or less.
(3) The metal mask material according to (1) or (2), wherein the impurities are limited to Si: 0.30% or less, Mn: 0.70% or less, Al: 0.01% or less, Mg: 0.0005% or less, P: 0.030% or less, and S: 0.015% or less.
(4) The metal mask material according to any one of (1) to (3), wherein an average {111} lattice spacing from 1.45 μm to 7.11 μm below the surface satisfies the following formula (1-1) and formula (1-2):

$$\Delta D \leq 0.00030 \quad (1\text{-}1)$$

$$\Delta D = |D_M - D_L| \quad (1\text{-}2)$$

where, the definitions of $D_M$ and $D_L$ in the above formulas are as follows:
$D_M$: average {111} lattice spacing (units: nm) obtained by grazing incidence X-ray diffraction technique;
$D_L$: reference value of {111} lattice spacing (units: nm) or average {111} lattice spacing (units: nm) calculated from a lattice constant of a bulk (5) The metal mask material according to any one of (1) to (3), wherein the following formula (2-1) is satisfied.

$$X(H_{w111}, t) = H_{w111}/\sqrt{t/25} \leq 0.545 \quad (2\text{-}1)[\text{Mathematical 1}]$$

where, in the formula, $H_{w111}$ is an average full width at half maximum 0155 (FWHM) of the {111} plane from 1.45 μm to 7.11 μm below the surface obtained by the grazing incidence X-ray diffraction technique and "t" is a thickness of the metal mask material (μm).

(6) The metal mask material according to any one of (1) to (3), wherein either of the following formula (3-1) or formula (3-2) is satisfied.

$$r_{max} < 9.5 \quad (3\text{-}1)$$

$$r_{max} \geq 20 \quad (3\text{-}2)$$

$$r = I_{111}/I_{200} \quad (3\text{-}3)$$

where, $I_{111}$ is an integrated intensity of the {111} plane from 1.45 μm to 7.11 μm below the surface obtained by the grazing incidence X-ray diffraction technique;
$I_{200}$ is an integrated intensity of the {200} plane from 1.45 μm to 7.11 μm below the surface obtained by the grazing incidence X-ray diffraction technique;
$r_{max}$ is a maximum value of a ratio of integrated intensities defined by the formula (3-3).

(7) The metal mask material according to any one of (1) to (3), wherein the following formula (4-1) to formula (4-3) are satisfied:

$$0.385 \leq I_{200}/\{I_{111}+I_{200}+I_{220}I_{311}\} \quad (4\text{-}1)$$

$$I_{311}/\{I_{111}+I_{200}+I_{220}+I_{311}\} \geq 0.08 \quad (4\text{-}2)$$

$$0.93 \leq \{I_{220}+I_{200}\}/\{I_{111}+I_{200}+I_{220}+I_{311}\} \quad (4\text{-}3)$$

where, in the formulas, $I_{200}$ is the diffraction intensity of the {200} plane obtained by the focusing method of X-ray diffraction, $I_{111}$ is the diffraction intensity of the {111} plane, $I_{220}$ is the diffraction intensity of the {220} plane, and $I_{311}$ is the diffraction intensity of the {311} plane.

(8) The metal mask material according to any one of (1) to (3), wherein an error calculated when measuring a residual stress using an X-ray stress measurement technique satisfies the following formula (5-1).

$$\sigma \leq \alpha + \beta \times R + \gamma \times R^2 \quad (5\text{-}1)$$

where, $\alpha=211.1$; $\beta=5.355$; $\gamma=0.034886$; R in the above formula is the value of the residual stress analyzed using the X-ray stress measurement technique, and σ is the error calculated when measuring the residual stress using the X-ray stress measurement technique.

(9) The metal mask material according to any one of (1) to (3), wherein when measuring stress using the X-ray stress measurement technique, the relationship between an angle (Ψ (deg)) formed by a plane normal of the metal mask material and the {220} plane at the angle Ψ and a diffraction peak position of the {220} plane (2θ (deg)) is expressed by the following formula (6-5) and coefficients "b", "c", "d", and "e" of the formula (6-5) satisfy the following formula (6-1) to formula (6-4).

$$b/I \leq 0.09 \quad (6\text{-}1)$$

$$0.02 \leq |c| \quad (6\text{-}2)$$

$$d/I \leq 12 \quad (6\text{-}3)$$

$$2 \geq |e|/I \quad (6\text{-}4)$$

$$2\theta = a + b \times \sin^2\Psi + c \times \sin(d \times \sin^2\Psi + e) \quad (6\text{-}5)$$

where, $I=(z \times t^3)/12$
t: thickness (μm)
z: 0.000768

(10) The metal mask material according to any one of (4) to (9), wherein a thickness of an oxide film measured by Auger electron spectrometry is 4.5 nm or less.
(11) The metal mask material according to any one of (4) to (10), wherein a 0.2% yield strength is 330 MPa or more and 85 MPa or less.
(12) The metal mask material according to any one of (4) to (11), wherein an average arithmetic surface roughness Ra of a direction perpendicular to the rolling direction is 0.02 μm or more and 0.10 μm or less.
(13) A method for manufacturing a metal mask material according to any one of (1) to (12), comprising
   a process of melting an alloy having a composition according to any one of (1) to (3),
   a process of obtaining a slab from the melted alloy,
   a coiling process of hot rolling and coiling the slab to obtain hot rolled coil
   a process of alternately cold rolling and annealing the hot rolled coil at least once each after the coiling process to obtain steel foil of a thickness of 5.00 to 50.00 μm, and
   a tension annealing process,
   the tension annealing process being performed after the final rolling process, a rolling reduction in a final rolling process being 30.0% or more and 95.0% or less, and the tension annealing process being performed by an annealing temperature of 300 to 900° C. in a reducing atmosphere.
(14) A metal mask using a metal mask material of any one of (1) to (12).

Advantageous Effects of Invention

According to the present invention, it is possible to provide a metal mask material with little amount of warpage and enabling precision etching corresponding to higher pixel densities of OLEDs and a metal mask using that metal mask material.

BRIEF DESCRIPTION OF DRAWINGS

FIG. 6 is a schematic view explaining an effect of uniform strain on a diffraction angle at an X-ray diffraction peak and an effect of non-uniform strain on a FWHM of an X-ray diffraction peak.
FIG. 8A is an X-ray diffraction pattern of a metal mask material observed based on the focusing method and 8B is a graph of the relationship of the average {200} lattice spacings obtained from the results of measurement by the focusing method and amounts of warpage.
FIGS. 12-2(c) to (e) are graphs plotting diffraction peak positions (2θ (deg)) of the {220} plane at Ψ angles and values of sin²Ψ at Ψ angles as coordinates on graphs having ordinates of the values of "2θ (deg)" and abscissas of the values of "sin²Ψ" using the focusing method for each of Samples "c" to "e" and the least square approximation lines of the same.
FIG. 13 is a graph plotting residual stress values calculated from X-ray diffraction peaks of the {220} plane using the focusing method and error of the residual stress values for each of Samples "a" to "e".
FIGS. 14-1(a) and (b) are graphs plotting diffraction peak positions (2θ (deg)) of the {220} plane at Ψ angles and values of sin²Ψ at Ψ angles as coordinates on graphs having ordinates of the values of "2θ (deg)" and abscissas of the values of "sin²Ψ" using the focusing method for each of Samples "a" and "b".
FIGS. 14-2(c) to (e) are graphs having plotting peak positions (2θ (deg)) of diffraction of the {220} plane at Ψ angles and values of sin²Ψ at Ψ angles as coordinates on graphs having ordinates of the values of "2θ (deg)" and abscissas of the values of "sin²Ψ" using the focusing method for each of Samples "c" to "e"

FIG. 15-1 is a graph showing a relationship of parameters "b" and "c" of an approximation curve (6-5) and an amount of warpage for each of Samples "a" to "e".

FIG. 15-2 is a graph showing a relationship of parameters "d" and "e" of an approximation curve (6-5) and an amount of warpage for each of Samples "a" to "e".

DESCRIPTION OF EMBODIMENTS

Figure 1:
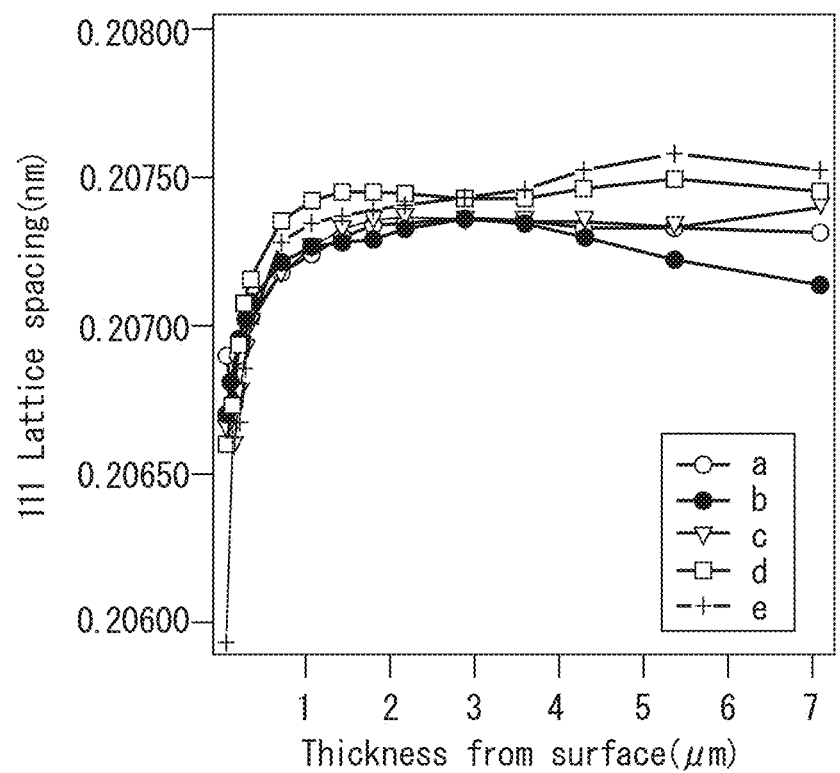
FIG. 1 is a graph showing depths down to 7 μm from a surface of a metal mask material of manufacturing examples and results of measurement of 111} lattice spacings at those depth positions.

Below, the metal mask material and metal mask of the present invention will be explained in detail. First, the composition of the metal mask material of the present invention will be explained. The "%" relating to the elements will mean mass % unless otherwise indicated.

Chemical Composition of Metal Mask Material

The metal mask material of the present invention contains the following constituents and comprises a balance of iron and impurities.

Ni: 35.0 to 37.0%

Nickel (Ni) is a main constituent for keeping a coefficient of thermal expansion of an alloy low. For this reason, the Ni content must be adjusted to 35.00% or more. However, if the Ni content is too high, after the hot rolling or after the hot forging, a bainite microstructure will easily form in the steel. Therefore, the Ni content is 37.0% or less.

Co: 0.00 to 0.50%

This is a constituent enabling a much greater reduction in the coefficient of thermal expansion of the alloy if increasing the amount of addition in relation to the amount of Ni. However, this is an extremely expensive element, so the upper limit of the Co content is made 0.50%.

Other Constituents

In the composition of the metal mask material of the present invention, from the viewpoint of reducing the spinel and other inclusions, part of the iron may be changed to the following composition. The contents of C, Ca, Mn, Si, Mg, and Al may also be 0%.

C: 0.05% or Less

Carbon (C) raises the strength of the metal mask material. However, if C is excessively included, the inclusions derived from carbides of the alloy increase. Therefore, the content of C which may be contained in the metal mask material may be made 0.05% or less.

Ca: 0 to 0.0005%

Calcium (Ca) dissolves in the sulfides to cause the sulfides to finely disperse and to make the shapes of the sulfides spherical. If the content of Ca is too low, that is, if the content of Ca with respect to the content of S is too low, it will be hard for the Ca to dissolve in the sulfides and hard for the sulfides to be made spherical. On the other hand, if Ca is too great, the content of Ca becomes too high with respect to the content of S, the Ca not dissolving in the sulfides form coarse oxides, and poor etching is liable to occur. For this reason, the amount of Ca is preferably made 0.0005% or less. The preferable range of the amount of Ca may be made 0.0001% or less.

Mn: 0 to 0.70%

Manganese (Mn) is proactively used as a deoxidizer instead of Mg and Al so as to avoid the formation of spinel. However, if the Mn content is too high, the Mn segregates at the grain boundaries aggravating intergranular fracture and causing hydrogen embrittlement resistance to conversely deteriorate. Therefore, the Mn content is preferably made 0.70% or less. The preferable range of the Mn content is made 0.30% or less.

Si: 0 to 0.30%

Silicon (Si) is proactively used for deoxidation by Mn and Si instead of deoxidation by Mg and Al so as to avoid the formation of spinel. However, Si makes the coefficient of thermal expansion of the alloy increase. A metal mask material is sometimes used in a 200° C. or so temperature environment so that the organic EL luminescent material released from the vapor deposition source can pass through the mask holes. For this reason, in the metal mask material of the present invention, Si is limited to 0.30% or less. The deoxidation product $MnO-SiO_2$ forms soft glassified inclusions which are stretched and split during the hot rolling to be made finer. For this reason, the hydrogen embrittlement resistance property rises. On the other hand, if the Si content exceeds 0.30%, the strength becomes too high. In this case, the workability of the alloy falls. The preferable range of the Si content may be made 0.01% or less.

Mg: 0 to 0.0005%

Magnesium (Mg) deoxidizes steel. However, if the Mg content is over 0.0005%, coarse inclusions are formed and poor etching is liable to occur. Further, to avoid the formation of spine, the content of Mg preferably is low. Therefore, the Mg content is preferably 0.0001% or less.

Al: 0 to 0.010%

Aluminum (Al) deoxidizes steel. However, if the Al content is over 0.010%, coarse inclusions are formed and poor etching is liable to occur. Further, to avoid the formation of spinel, the content of Al preferably is low. Therefore, the preferable range of the Al content is 0.001% or less.

Impurities

In the composition of the metal mask material of the present invention, P, S, and other constituents may be mentioned as impurities. The contents of the impurities are limited to within the following ranges.

P: 0.030% or Less: S: 0.015% or Less

P and S are elements bonding with Mn and other alloy elements in the metal mask material to form inclusions, so P is limited to 0.030% or less and S is limited to 0.015% or less. Preferably, P may be made 0.003% or less and S may be made 0.0015% or less.

Thickness

The present invention can be applied to a metal mask material of a thickness of 50.00 µm or less in the same way as ordinary mask materials. Since formation of a high definition pattern is sought, thicknesses are being made thinner as a general trend. That is, the invention can be applied to metal mask materials of a thickness of 30.00 µm or less, 25.00 µm or less, 20.00 µm or less, 15.00 µm or less, or 10.00 µm or less. The lower limit is not particularly set, but may be made 5.00 µm for reasons of manufacture by rolling.

Amount of Warpage

A square shaped sample of 100 mm sides was cut out from a metal mask material and was etched from one surface of the sample to thereby remove ⅗ of the thickness of the sample, then the etched sample was placed on a surface plate. The maximum value in the amounts of rise of the four corners of the thus placed sample was used as the amount of warpage of that metal mask material. The etching method is not particularly limited, but one surface of the sample may be protected by a resist, then the sample dipped in a ferric chloride aqueous solution or other etching solution.

The smaller the amount of warpage the better. 5.0 mm or less is good. The upper limit of the amount of warpage may be made 4.5 mm, 4.0 mm, 3.5 mm, 3.0 mm, 2.5 mm, 2.0 mm, 1.5 mm, 1.0 mm, or 0.5 mm.

Measuring the amount of warpage by placing the sample on a surface plate enables it to be evaluated in a state closest to the state of the etching at the time of actual mask manufacture. In the past, there have also been examples of suspending a top end of a short strip shaped cut sample in a state contacting a vertical surface plate and using the distance of the bottom end of the cut sample from the vertical surface plate (horizontal distance) as the amount of warpage (PTL 9). However, with this, only the amount of bending in the length direction is evaluated (2D evaluation), so the amount of warpage on a plane cannot be evaluated (3D evaluation). By the evaluation of the amount of warpage at a plane employed in the present invention, it is possible to evaluate the amount of warpage in three dimensions in a state close to actual mask manufacture.

Below, the metal mask material of the present invention and the method for manufacturing the same and a metal mask will be explained in detail while giving specific embodiments while referring to the drawings, but the present invention is not limited to these specific embodiments.

Before half etching, the metal mask material is flat and there are no deformed locations, but after the half etching, the above-mentioned warpage occurs. On the other hand, before and after half etching the metal mask material, the thickness of the metal mask material changes and the balance of the residual stress of the metal mask material changes, so the distribution of strain in the thickness direction and the amount of warpage are related.

The inventors thought that if identifying the parameters directly or indirectly relating to strain of the metal mask material in the thickness direction, it would be possible to control the parameters to thereby control the residual stress of the metal mask material. Therefore, the embodiments of the present invention are characterized by suppressing the amount of warpage by controlling the parameters directly or indirectly relating to strain of the metal mask material in the thickness direction.

First Embodiment

First, a first embodiment of a metal mask material of one example of the first aspect will be explained in detail.

The crystal structure of the metal mask material is a face-centered cubic lattice (fcc), so the slip planes are the {111} plane. Therefore, the inventors thought that the {111} lattice spacings in the thickness direction of the metal mask material are related to the distribution of uniform strain in the thickness direction and engaged in intensive research on the relationship of the {111} lattice spacings of the metal mask material in the thickness direction and the amounts of warpage after half etching.

As a result, the inventors discovered that by manufacturing a metal mask material so that the difference between the average {111} lattice spacing measured along the thickness direction by the grazing incidence X-ray diffraction technique and the average {111} lattice spacing calculated from the average lattice constant of the bulk becomes smaller and using that metal mask material, it is possible to reduce the amount of warpage. The first embodiment is based on this finding.

Relationship of Average {111} Lattice Spacing and Amount of Warpage after Half Etching The relationship between the {111} lattice spacings in the thickness direction of the metal mask material and the amount of warpage will be explained below.

Metal mask materials of the Samples "a" to "e" were manufactured by adjusting the rolling reduction of the cold rolling and the annealing temperature under the manufacturing conditions shown in Table 1. Each of these metal mask materials was measured for the {111} lattice spacings in the thickness direction under the following conditions. Further, Samples "a" to "e" were comprised of an Ni content of 36.0% and a balance of iron and impurities. Further, the contents of Al, Mg, Mn, Si, P, S, and other impurities were all the detection limits or less. The "final annealing temperature (° C.)" of Table 1 is the annealing temperature of the tension annealing process performed after the final rolling process. Below, unless otherwise indicated, the annealing temperature of the tension annealing process performed after the final rolling process will be referred to as the "final annealing temperature (° C.)".

Each of Samples "a" to "e" of Table 1 was cut into a 100 mm square, one surface of the cut sample was covered by a resist, then the sample was dipped in a ferric chloride aqueous solution until the thickness became ⅔ to thereby half etch it. Next, the half etched sample was placed on a surface plate. The maximum value of the heights of rise of the four corners of the sample from the surface plate was measured. The measured maximum value was made the amount of warpage after half etching of each of Samples "a" to "e"

TABLE 1

| Sample | Thickness (μm) | Thickness before final rolling (μm) | Final rolling reduction (%) | Final annealing temperature (° C.) | Amount of warpage (mm) |
| --- | --- | --- | --- | --- | --- |
| a | 25 | 100 | 75.0 | 500 | 5.8 |
| b | 25 | 85 | 70.6 | 650 | 10.8 |
| c | 25 | 300 | 91.7 | 650 | 4.5 |
| d | 25 | 300 | 91.7 | 750 | 2.0 |
| e | 30 | 60 | 50 | 650 | 1.7 |

The {111} lattice spacings along the thickness direction were measured by the grazing incidence X-ray diffraction technique. Further, the anticathode of the X-ray diffraction system was Co, while the tube voltage and current at the time of measurement were respectively made 40 kV and 135 mA. Further, the grazing incidence X-ray diffraction technique was performed using a parallel beam optical system (SmartLab) made by Rigaku. The penetration depth in the samples when irradiating X-rays to the surfaces of the samples at the incident angles (θ) of the samples of 0.2°, 0.4°, 0.6°, 0.8°, 1.0°, 2.0°, 3.0°, 4.0°, 5.0°, 6.0°, 8.0°, 10.0°, 12.0°, 15.0°, and 20.0° were calculated by the X-ray mass absorption coefficients and the calculated penetration depth were converted to penetration depth in the direction vertical to the surfaces. Measurement was performed by setting a 5.0° solar slit at the incident side and a 5.0° solar slit at the receiving side, not using a parallel slit analyzer (PSA), and making the receiving slit 1 (RS1)=receiving slit 2 (RS2)=1.0 mm.

Figure 2:
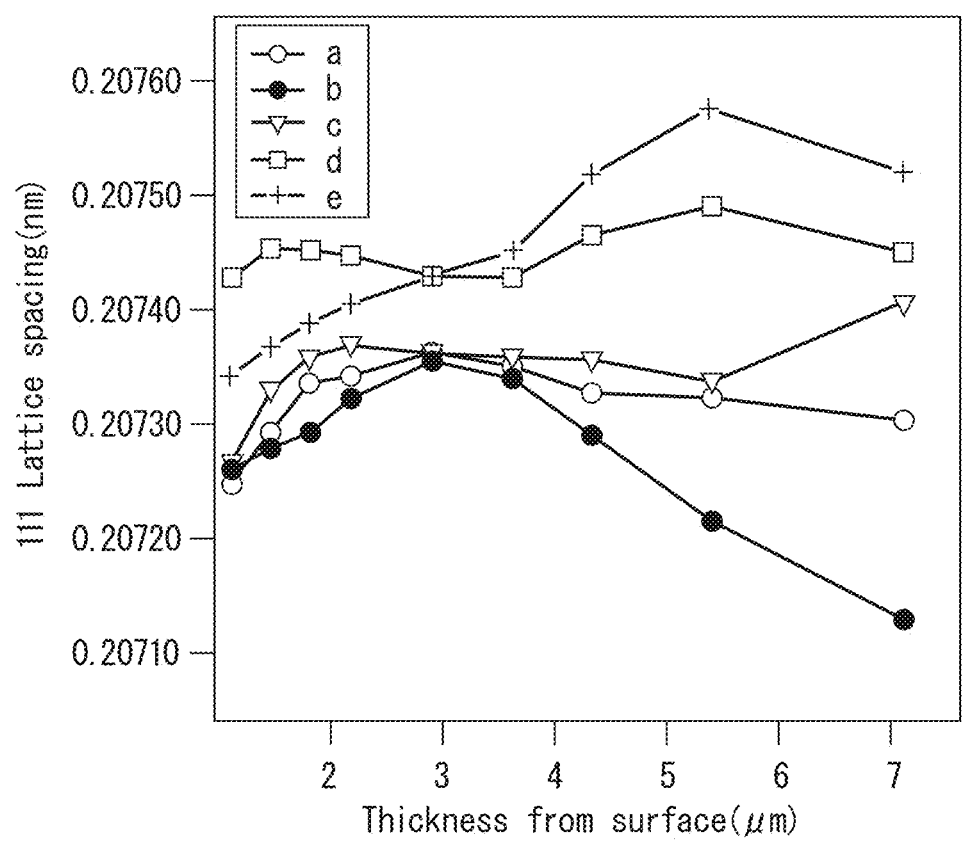
FIG. 2 is a graph showing depths of 1 μm down to 7 μm below a surface of a metal mask material of manufacturing examples and results of measurement of {111} lattice spacings at those depth positions.

FIG. 1 shows the results of measurement of the penetration depths in a direction vertical to the surface (depth from surface) measured for each incident angle of a parallel beam optical system and the {111} lattice spacings oat the depth positions. As shown in FIG. 1, in the region from the surface down to a depth of 1 μm, the change in the {111} lattice spacings was great, but each of the metal mask materials of Samples "a" to "e" changed in similar ways. On the other hand, in the region from a depth of 1 μm from the surface to 7 μm, the {111} lattice spacings are stabler compared with the change of the {111} lattice spacings in the region from the surface down to a depth of 1 μm, but as shown in FIG. 2, changed in different ways depending on the sample.

The average lattice spacing (units: nm) of the {111} plane obtained by the grazing incidence X-ray diffraction technique is found by directly measuring and averaging the {111} lattice spacings in the region from the surface down to a depth of 1 μm or more for the different depths by the grazing incidence X-ray diffraction technique. Further, the depths of measurement of the {111} lattice spacings by the grazing incidence X-ray diffraction technique are preferably made from 1.45 μm to 7.11 μm below the surface.

Figure 3:
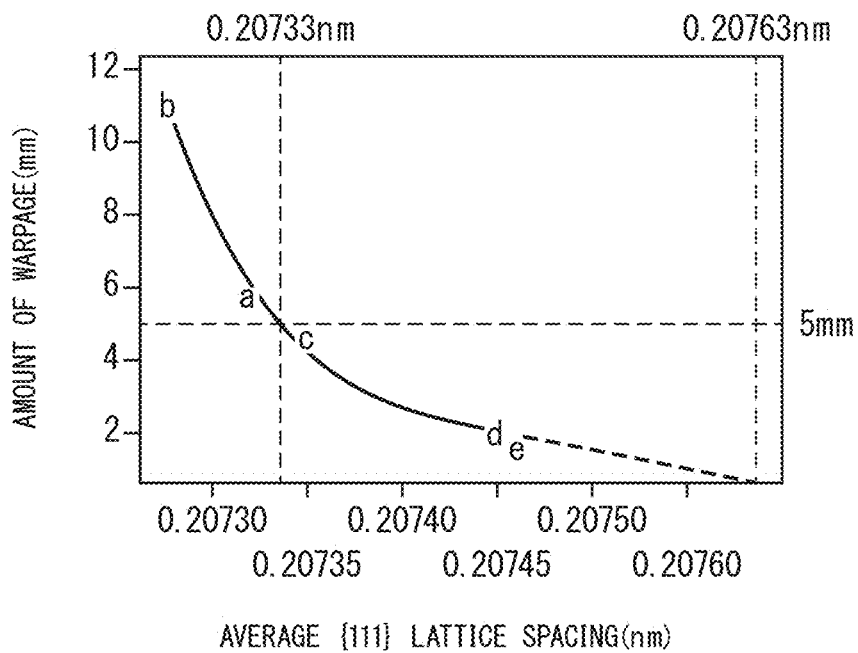
FIG. 3 is a graph showing a relationship of average {111} lattice spacings down to 10.0 μm from a surface of a metal mask material of manufacturing examples and amounts of warpage of a metal mask material.

FIG. 3 is a graph showing the relationship between the average {111} lattice spacing obtained by measurement using the grazing incidence X-ray diffraction technique from the surface down to 10.0 μm and the amount of warpage for each of the metal mask materials of Samples "a", "b", "c", "d", and "e". As will be understood from FIG. 3, the amount of warpage decreases along with an increase in the average {111} lattice spacing obtained by measurement using the grazing incidence X-ray diffraction technique.

The reference value of the {111} lattice spacings of the metal mask material (Fe-36 mass % Ni) of Samples "a", "b", "c", "d", and "e" was made the {111} lattice spacing when the amount of warpage after half etching became 0. The reference value of the {111} lattice spacings was obtained by approximation of the measured values of the amounts of warpage of these samples by an exponential function having the average {111} lattice spacing as a parameter. The value of the abscissa where the value of the ordinate of the approximation curve (amount of warpage) becomes 0 is the reference value of the {111} lattice spacings. The reference value of the {111} lattice spacings of the metal mask material of Samples "a", "b", "c", "d", and "e" was 0.20763 nm. When the absolute value (ΔD) of the difference between the average {111} lattice spacing obtained by the grazing incidence X-ray diffraction technique in this way and the reference value of the {111} lattice spacings (0.20763 nm) is 0.00030 nm or less, the amount of warpage decreases to 5.0 mm or less.

Further, as the reference value of the {111} lattice spacings, it is also possible to use the average {111} lattice spacing calculated from each average lattice constant of the bulk obtained by measurement of the metal mask material of Samples "a", "b", "c", "d", and "e" by the focusing method. However, due to the crystal orientation of the bulk, it is not possible to directly examine the diffraction pattern of the {111} plane using the focusing method. Therefore, the focusing method is used to measure the average lattice constant of the bulk of the alloy forming the metal mask material and the following means is used to calculate the average lattice spacing ($D_L$ (units: nm)) of the {111} plane from the average lattice constant of the bulk.

First, the values of a Nelson-Riley function $\frac{1}{2} \times \{\cos^2\theta/\sin^2\theta + (\cos^2\theta)/\theta\}$ were calculated from the incident angle (2θ) measured by the focusing method. The obtained values were plotted as the x-coordinates while the average {111} lattice spacings obtained from the Bragg's law were plotted as the y-coordinates. Next, the value of the y-intercept of the straight line obtained by the least square method may be found, the value may be calculated as the average {111} lattice spacing, and the value may be used as the "reference value of the {111} lattice spacings".

The metal mask material according to the first embodiment is based on this finding and is characterized by the average {111} lattice spacing from 1.45 μm to 7.11 μm below the surface satisfying the following formulas (1-1) and (1-2):

$$\Delta D \leq 0.00030 \quad (1\text{-}1)$$

$$\Delta D = |D_M - D_L| \quad (1\text{-}2)$$

where, in the above formula, $D_M$ and $D_L$ are defined as follows:

$D_M$: average {111} lattice spacing obtained by grazing incidence X-ray diffraction technique (unit: nm);

$D_L$: reference value of {111} lattice spacing (unit: nm) or average {111} lattice spacing calculated from average lattice constant of bulk (unit: nm)

Further, other than the Nelson-Riley function, the Rietveld method or NPL 1 and other literature may be used to calculate the reference value of the {111} lattice spacing and the average lattice spacing may be made the value of $D_L$. Further, Vegard's law may be used to calculate the reference value of the {111} lattice spacing of the metal mask material between an Ni content of 35.0 to 37.0%. Specifically, it is also possible to measure the average {111} lattice spacings of metal mask materials with mutually different Ni contents (35.0% or more and 37.0% or less) and to calculate the reference value of the {111} lattice spacing of the metal mask material by interpolation or extrapolation from the measured average {111} lattice spacings.

As explained above, the absolute value (ΔD) of the difference between the average lattice spacing $D_M$ of the {111} plane obtained by the grazing incidence X-ray diffraction technique and the reference value of the {111} lattice spacing (0.20763 nm) is related with the amount of warpage. The smaller the ΔD, the better. Therefore, to further raise the etching precision, the ΔD is preferably made 0.00020 or less, more preferably 0.00015 or less, Second Embodiment Next, a second embodiment will be explained in detail.

Lattice strain includes uniform strain and non-uniform strain. Among these, the non-uniform strain is an amount related to the dislocation density. As disclosed in NPL 2, uniform strain shifts the diffraction angle at the X-ray diffraction peak, while non-uniform strain has the effect of broadening the FWHM of the X-ray diffraction peak (FIG. 6). Uniform strain clarifies the microstructure of the measured object. The microstructure has an effect on the residual stress of the measured object.

The crystal structure of a metal mask material is a face-centered cubic lattice (fcc), so the slip planes are the {111} plane. Therefore, the inventors thought that the FWHM of the X-ray diffraction peaks at the {111} plane in the thickness direction of the metal mask material are related to the distribution of uniform strain and non-uniform strain in the thickness direction and engaged in intensive research regarding the relationship between the FWHM of the X-ray diffraction peaks at the {111} plane in the thickness direction of the metal mask material and the amounts of warpage.

As a result, the fact that by manufacturing the metal mask material so that the average FWHM of the {111} plane becomes smaller in the thickness direction and using the metal mask material, it is possible to reduce the amount of warpage was discovered by the inventors.

However, in the average FWHM of the {111} plane, it is believed necessary to consider the effects due to the thickness of the metal mask material. The reason why is that a metal mask material is microscopically a "rigid body" and the uniform strain and non-uniform strain of the metal mask material can also be said to be deformation as a rigid body. Further, even among metal mask materials with identical average FWHM of the {111} plane, it is believed that if bending moment is large, the extent of deformation is also small.

Therefore, the inventors thought that the amount of warpage can be more suitably judged by using the value of the average FWHM of the {111} plane corrected by a reciprocal of the bending moment. Further, the bending moment of a sheet member of a rectangular shape is proportional to the thickness "t", so the inventors engaged in intensive research on the relationship among the amounts of warpage, the magnitudes of the average FWHM of the {111} plane, and the reciprocal of the thickness of the metal mask material and as a result discovered that the amount of warpage is proportional to the reciprocal of the square root of the thickness of the metal mask material. The second embodiment is based on this finding.

Relationship of Average FWHM of {111} Plane and Amount of Warpage after Half Etching The relationship of the average FWHM of the {111} plane of the metal mask material in the thickness direction and the amount of warpage after half etching will be explained below.

Each of the metal mask materials of Samples "a" to "e" of Table 1 was measured for FWHM of the {111} plane in the thickness direction by the grazing incidence X-ray diffraction technique.

Further, the measurement conditions of the grazing incidence X-ray diffraction technique were made the same conditions as the first embodiment. Further, after measurement of the FWHM, half etching was performed in the same way as the first embodiment and the amount of warpage of each of Samples "a" to "e" of the metal mask materials of Table 1 was measured.

Figure 4:
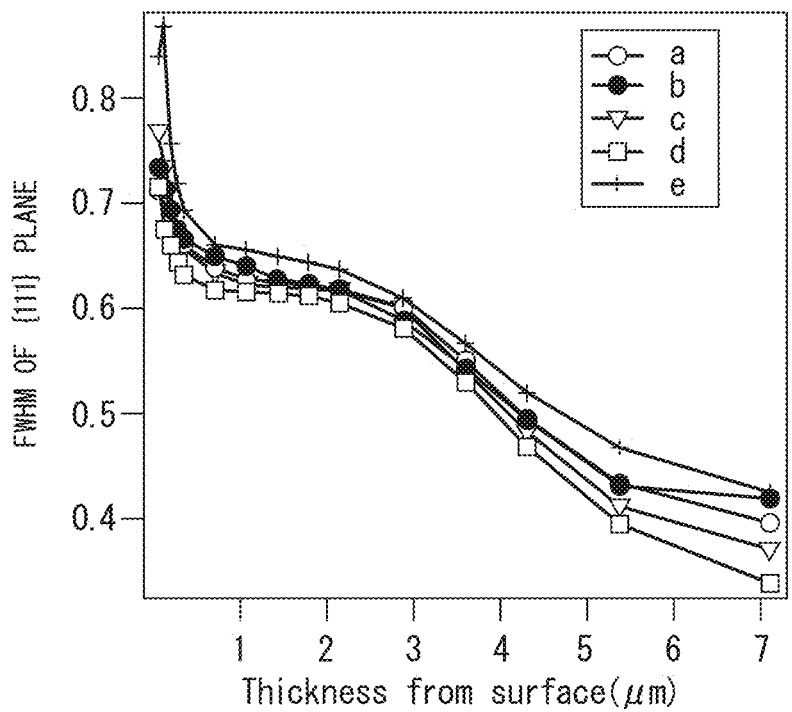
FIG. 4 is a graph showing depths down to 7.0 μm from a surface of a metal mask material of manufacturing examples and measurement results of FWHM of diffraction peaks at {111} plane at those depth positions.

FIG. 4 shows the results of measurement of the penetration depth in a direction vertical to the surface (depth from surface) measured for each incident angle of a parallel beam optical system and the FWHM of the {111} plane at the depth position. As shown in FIG. 4, in the region from the surface down to a depth of 1.45 μm, the change in the FWHM of the {111} plane is great, but each of the metal mask materials of Samples "a" to "e" changed in similar ways. On the other hand, in the region from a depth of 1.45 μm to 7.11 μm below the surface, the FWHM of the {111} plane is stabler compared with the change of the {111} lattice spacing in the region from the surface down to a depth of 1.45 μm, but changed in different ways depending on the sample.

Figure 5:
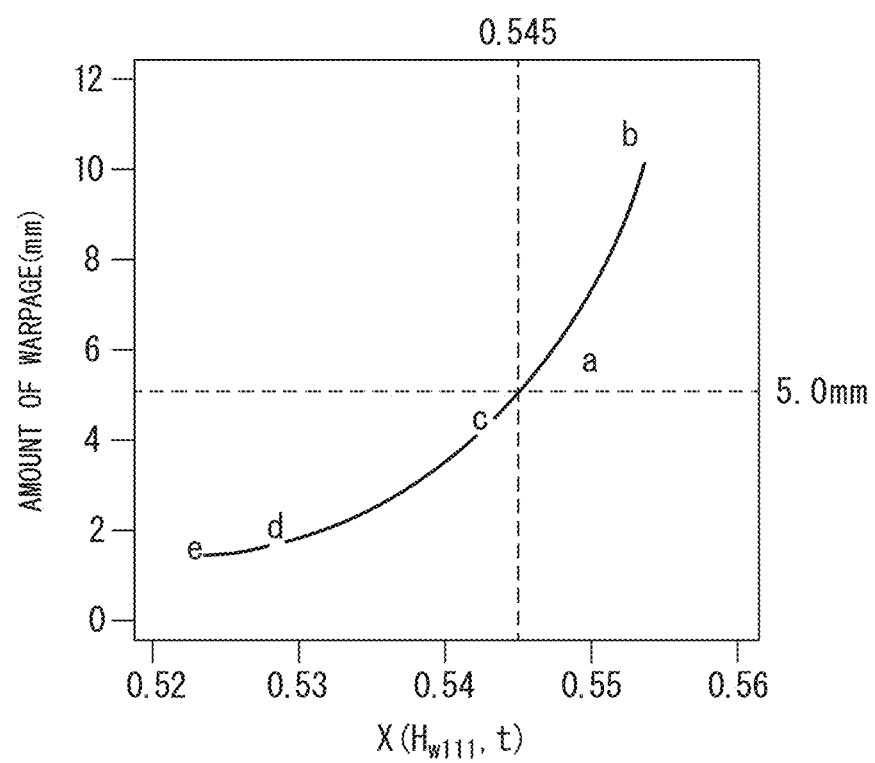
FIG. 5 is a graph showing a relationship of average values of FWHM of diffraction peaks at {111} plane down to 7.0 μm from a surface of a metal mask material of manufacturing examples and amounts of warpage of a metal mask material.

FIG. 5 is a graph showing the relationship between the average FWHM of the {111} plane from a depth of 1.45 μm below the surface down to 7.11 μm and the amount of warpage for each metal mask material of the Samples "a", "b", "c", "d", and "e". Here, the values of the abscissa are values of the average FWHM of the {111} plane considering the thickness and are given by the following formula:

$$X(H_{w111}, t) = H_{w111}/\sqrt{t/25} \qquad \text{[Mathematical 2]}$$

As shown in this graph, it is learned that the more the FWHM decreases, the more the amount of warpage decreases. That is, it is learned that the more the dislocation density of the metal mask material proceeds to decrease, the more the amount of warpage decreases. Further, the metal mask of the present invention is comprised of a material the same as the metal mask material, so the "t" of the above $X(H_{w111}, t)$ is the thickness (μm) of the metal mask.

Further, in FIG. 5, the amount of warpage rapidly decreases and the amount of warpage becomes less than 6.0 mm when the value of $X(H_{w111}, t)$ is less than 0.550. When the value of $X(H_{w111}, t)$ is 0.545 or less, the amount of warpage becomes 5.0 mm or less.

The metal mask material according to the second embodiment is based on this finding and is a metal mask material satisfying the following (2-1).

$$X(H_{w111}, t) = H_{w111}/\sqrt{t/25} \leq 0.545 \qquad \text{(2-1)[Mathematical 3]}$$

where, in the formula, $H_{w111}$ is the average FWHM of the {111} plane from 1.45 μm to 7.11 μm below the surface obtained by the grazing incidence X-ray diffraction technique, while "t" is the thickness (μm) of the metal mask material and metal mask.

Further, if the value of $X(H_{w111}, t)$ becomes 0.540 or less, the amount of warpage decreases to 3.0 mm or less, while if the value of $X(H_{w111}, t)$ becomes 0.530 or less, the amount of warpage decreases to less than 2.0 mm. In this way, the value of $X(H_{w111}, t)$ from the depth of 1.45 μm from the surface down to 7.11 μm is 0.545 or less, preferably 0.540 or less, more preferably 0.530 or less.

Third Embodiment

Next, a third embodiment will be explained in detail.

The crystal structure of the metal mask material is a face-centered cubic lattice (fcc), so the slip planes are the {111} plane. Therefore, the inventors thought that the {111} lattice spacings in the thickness direction of the metal mask material is related to the distribution of uniform strain in the thickness direction and engaged in intensive research on the relationship of the {111} lattice spacings of the metal mask material in the thickness direction and the amount of warpage after half etching.

Figure 7:
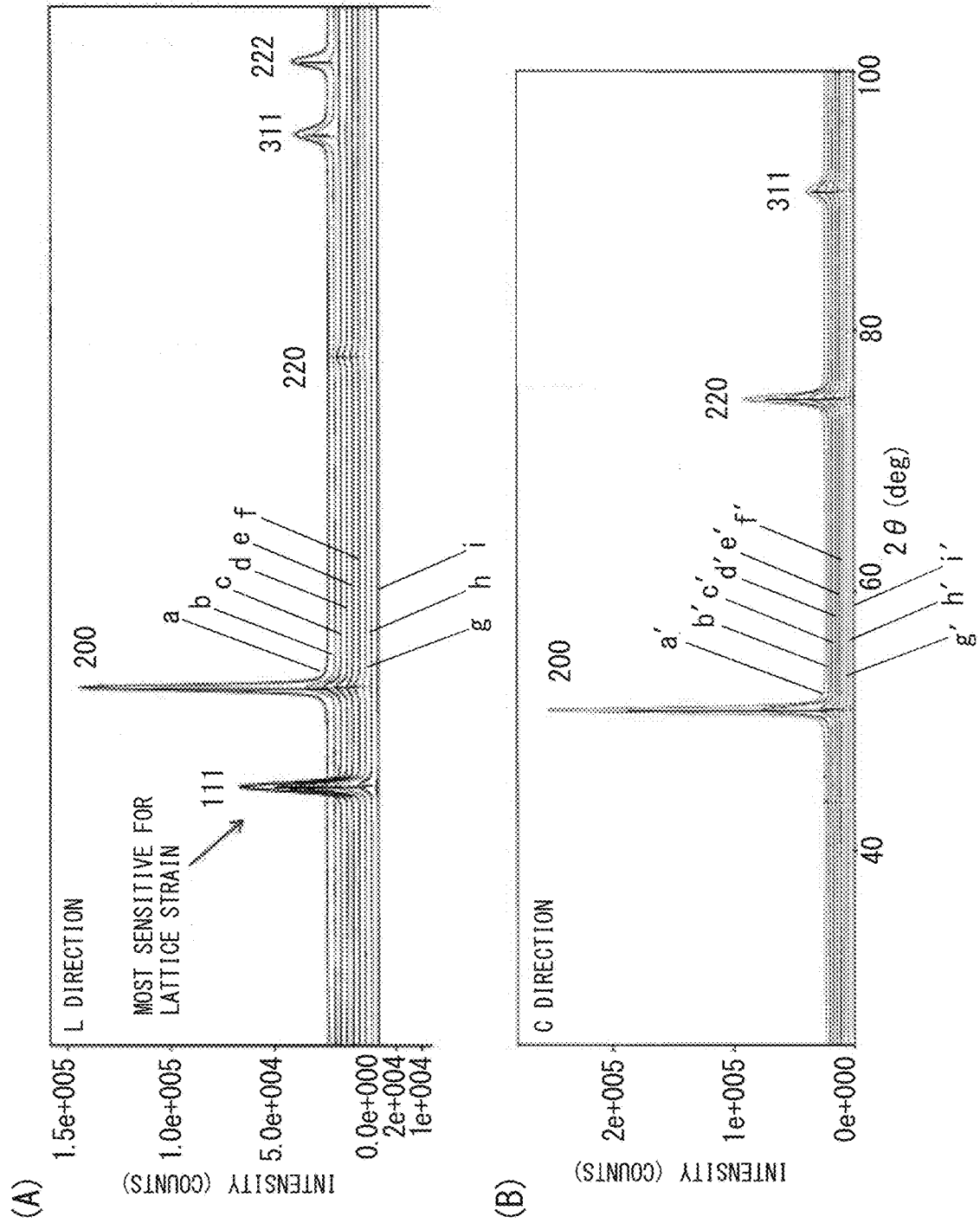
FIGS. 7A and 7B are X-ray diffraction patterns measured using a grazing incidence X-ray diffraction technique while changing an incident angle of the X-rays with respect to the surface of the metal mask material.

In the case of the grazing incidence X-ray diffraction technique, which is a parallel beam optical system X-ray diffraction technique, unlike measurement by the focusing method with Bragg-Brentano geometry, it is possible to measure the X-ray diffraction peak of the {111} plane. The intensity differs depending on the incident angle of X-rays with respect to the surface of the metal mask material. Further, the fact that, as shown in FIGS. 7A and 7B, the integrated intensity of the {111} plane is greater in change due to the incident angle of X-rays compared with the integrated intensity of X-ray diffraction of the {200} plane was discovered by the inventors.

TABLE 2

| Diffraction pattern | Incident angle with respect to surface (°) | Incident depth from surface (μm) |
|---|---|---|
| a | 20 | 7.11 |
| b | 15 | 5.38 |
| c | 10 | 3.61 |
| d | 5 | 1.81 |
| e | 2 | 0.73 |
| f | 1 | 0.36 |
| g | 0.8 | 0.29 |
| h | 0.4 | 0.15 |
| i | 0.2 | 0.07 |
| a' | 20 | 7.11 |
| b' | 15 | 5.38 |

TABLE 2-continued

| Diffraction pattern | Incident angle with respect to surface (°) | Incident depth from surface (μm) |
|---|---|---|
| c' | 10 | 3.61 |
| d' | 5 | 1.81 |
| e' | 2 | 0.73 |
| f' | 1 | 0.36 |
| g' | 0.8 | 0.29 |
| h' | 0.4 | 0.15 |
| i' | 0.2 | 0.07 |

Further, Table 2 shows the incident angle (°) with respect to the surface of the grazing incidence X-ray diffraction patterns "a" to "i" of the notations "a" to "i" of FIG. 7A and the incident angle (°) with respect to the surface of the grazing incidence X-ray diffraction patterns "a" to "i" of the notations "a" to "i" of FIG. 7B (the incident angle (θ) of to the surface of the sample) and the penetration depth of the incident X-rays from the surface (μm).

Further, using the grazing incidence X-ray diffraction technique, the ratio of the integrated intensity of the {111} plane and the integrated intensity of the {200} plane was measured in the thickness direction and compared, whereupon the fact that the larger the amount of warpage of the metal mask material, the smaller the change in the ratio of the integrated intensity of the {111} plane and the integrated intensity of the {200} plane near 2 to 3 μm depth and that the smaller the amount of warpage, the greater the change in the ratio of the integrated intensity of the {111} plane and the integrated intensity of the {200} plane was discovered by the inventors.

Further, the fact that if the change in the ratio of the integrated intensity of the {111} plane and the integrated intensity of the {200} plane near 2 to 3 μm depth is extremely large, the amount of warpage of the metal mask material becomes small was discovered by the inventors. The third embodiment is based on this finding.

Relationship of "r" ($=I_{111}/I_{200}$) and Amount of Warpage after Half Etching The relationship of the "r" ($=I_{111}/I_{200}$) value in the thickness direction of the metal mask material and the amount of warpage after half etching will be explained below:

Each of Samples "a" to "e" of Table 1 was measured for the X-ray diffraction peak of the {200} plane by the focusing method. The results are shown in FIG. 8A. Further, a graph of the average lattice spacing of {200} plane obtained from the measurement results of the focusing method and the amount of warpage is shown in FIG. 8B.

From FIG. 8B, it is believed that there is no correlation between the average {200} lattice spacing and the amount of warpage.

The {111} lattice spacing in the thickness direction, the integrated intensity $I_{111}$ of the {111} plane, and the integrated intensity $I_{200}$ of the {200} plane were measured by the grazing incidence X-ray diffraction technique.

Further, the anticathode of the X-ray diffraction system was Co, while the tube voltage and current at the time of measurement were respectively made 40 kV and 135 mA. Further, the grazing incidence X-ray diffraction technique was performed using a parallel beam optical system (Smart-Lab) made by Rigaku. The penetration depth in the samples when irradiating X-rays to the surfaces of the samples so that the incident angles (θ) became 0.2°, 0.4°, 0.6°, 0.8°, 1.0°, 2.0°, 3.0°, 4.0°, 5.0°, 6.0°, 8.0°, 10.0°, 12.0°, 15.0°, and 20.0° were calculated by the X-ray mass absorption coefficient and the information of calculated penetration depth and incident angle were converted to penetration depths in the direction vertical to the surfaces. Measurement was performed by setting a 5.0° solar slit at the incident side and a 5.0° solar slit at the receiving side, not using a parallel slit analyzer (PSA), and making the receiving slit 1 (RS1) =receiving slit 2 (RS2)=1.0 mm. The results are shown in Table 3 and FIG. 9.

TABLE 3

| Incident angle with respect to surface (°) | Incident depth from surface (μm) |
|---|---|
| 20.0 | 7.113971 |
| 15.0 | 5.3834 |
| 12.0 | 4.324534 |
| 10.0 | 3.611858 |
| 8.0 | 2.894781 |
| 6.0 | 2.174177 |
| 5.0 | 1.812827 |
| 4.0 | 1.450925 |
| 3.0 | 1.08858 |
| 2.0 | 0.725905 |
| 1.0 | 0.363008 |
| 0.8 | 0.290411 |
| 0.6 | 0.217812 |
| 0.4 | 0.145209 |
| 0.2 | 0.072605 |

The magnitude ("r" value) of the integrated intensity $I_{111}$ of the {111} plane based on the integrated intensity $I_{200}$ of the {200} plane is expected to reflect the relationship between the {111} lattice spacing and the amount of warpage. Further, the integrated intensity is obtained using evaluation software of the X-ray diffraction apparatus to remove the background of the X-ray diffraction peak and fitting the X-ray diffraction peak after removal of background using a split Voigt function.

Figure 9:
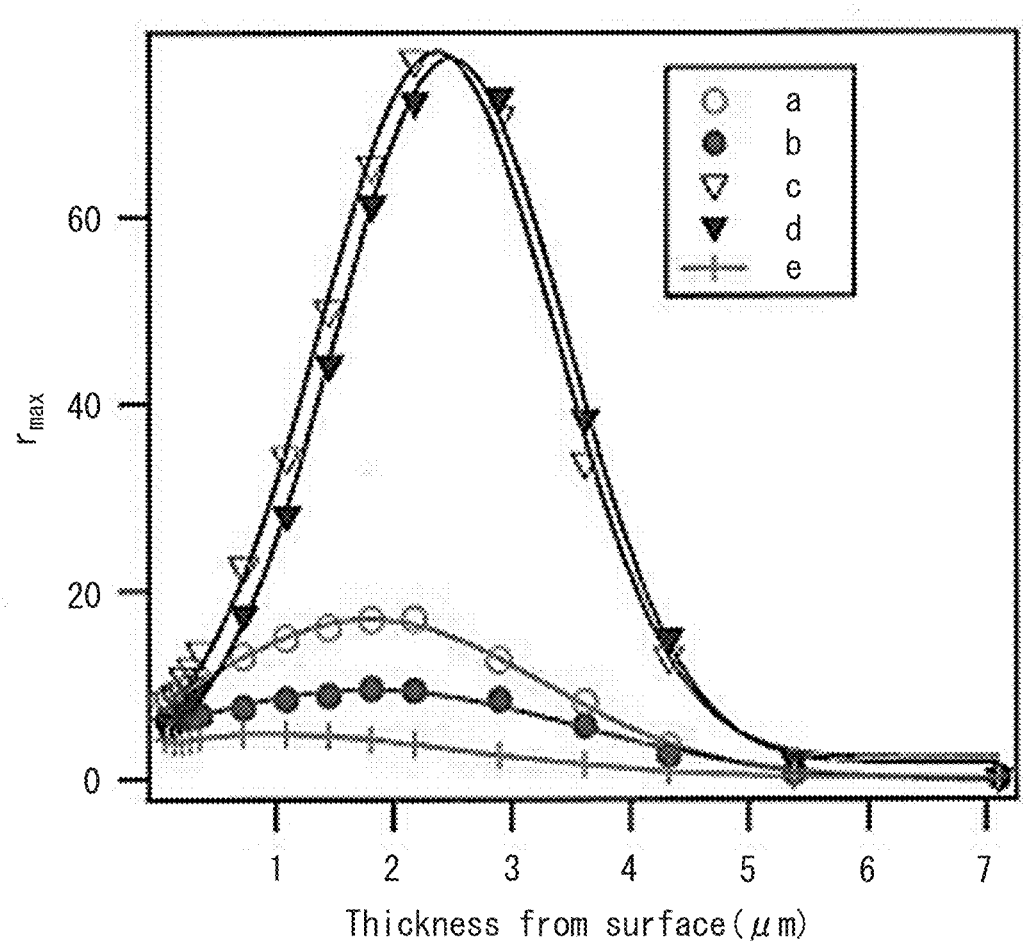
FIG. 9 is a graph showing a relationship of depths down to 7.0 μm from a surface of a metal mask material and a ratio "r" ($r=I_{111}/I_{200}$) of an integrated intensity $I_{111}$ of {111} plane to an integrated intensity $I_{200}$ of {200} plane for different manufacturing examples.

Further, based on the results of Table 3 and FIG. 9, each of Samples "a" to "e" of the metal mask materials of Table 1 was measured for the average {111} lattice spacing (ave-d) and the maximum value ($r_{max}$) of "r" in the region of a depth of 1.00 μm from the surface down to 7.00 μm. Further, each of the Samples "a" to "e" of the metal mask materials of Table 1 was measured for tensile strength (TS), then was half etched in the same way as the first embodiment and measured for amount of warpage. The results are shown in Table 4.

TABLE 4

| Sample | ave-d (×0.1 nm) | $r_{max}$ | Amount of warpage (mm) | TS (MPa) |
|---|---|---|---|---|
| a | 2.073209 | 17.04928 | 5.8 | 755 |
| b | 2.072781 | 9.580585 | 10.8 | 790 |
| c | 2.073501 | 78.74973 | 4.5 | 856 |
| d | 2.074508 | 72.76447 | 2.0 | 812 |
| e | 2.074571 | 4.845098 | 1.7 | 719 |

As shown in FIG. 9, Samples "c" and "d" changed greatly in $r_{max}$ value compared with Samples "a", "b", and "e" at a depth below the surface of 1.45 μm to 7.11 μm. On the other hand, according to Table 4, it is learned that the metal mask materials of Samples "c" and "d" are smaller in amount of warpage after half etching compared with "a" and "b".

Figure 10:
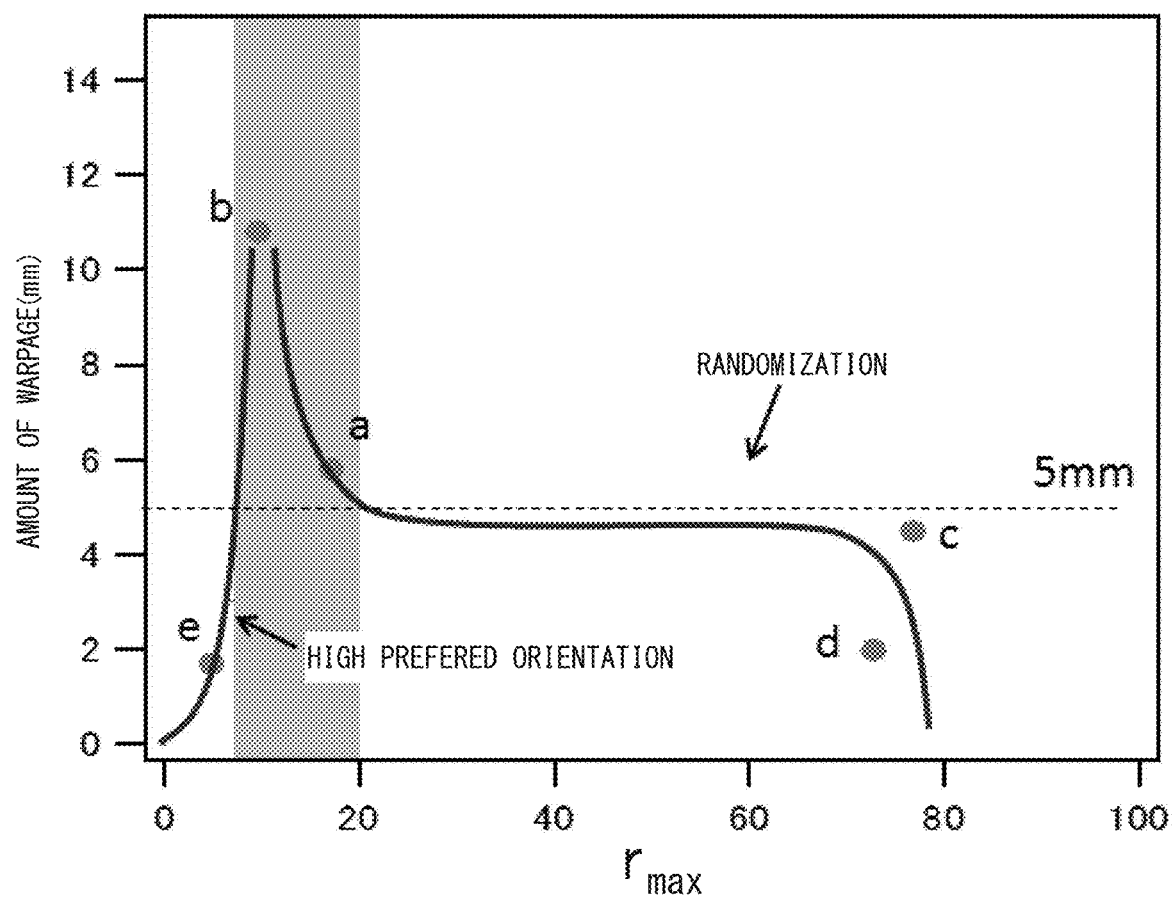
FIG. 10 is a graph showing a relationship of $r_{max}$ and an amount of warpage of a metal mask material.

FIG. 10 is a graph showing the relationship between $r_{max}$ and the amount of warpage. Samples "b" and "e" show the effects of strong working. The distribution was approximated by a Gauss function. Further, Samples "a", "b", "c", and "d" have random microstructures and increase in amount of warpage the closer the $r_{max}$ value to the Sample "e". From this, it is believed that the random microstructures of the Samples "a", "b", "c", and "d" and microstructures due to strong working act in concert against the amount of warpage after half etching, so the relationship between the $r_{max}$ values and amount of warpage of Samples "a", "b", "c", and "d" was approximated by the formula of Hill. The Samples "a" and "b" have both strongly worked constituents and random constituents, that is, the intermediate structures are large in non-uniformity, so these are outside the scope of the present invention. As shown in FIG. 10, it is learned that if $r_{max}$ satisfies the following formulas (3-1) and (3-2), the amount of warpage becomes less than 5.0 mm:

$$r_{max}<9.5 \tag{3-1}$$

$$r_{max}\geq 20 \tag{3-2}$$

The metal mask material according to the third embodiment is based on this finding and is characterized by satisfying either of the following formula (3-1) or formula (3-2):

$$r_{max}<9.5 \tag{3-1}$$

$$r_{max}\geq 20 \tag{3-2}$$

$$r=I_{111}/I_{200} \tag{3-3}$$

where, $I_{111}$ is the integrated intensity of the {111} plane from 1.45 μm to 7.11 μm below the surface obtained by the grazing incidence X-ray diffraction technique;

$I_{200}$ is the integrated intensity of the {200} plane from 1.45 μm to 7.11 μm below the surface obtained by the grazing incidence X-ray diffraction technique; and $r_{max}$ is the maximum value of the intensity ratio "r" defined by formula (3-3).

In the case of formula (3-1), that is, if $r_{max}<9.5$, crystal orientation uniformly proceeds, a residual stress large enough to compensate for the stress of the part removed by the etching is introduced, and conversely there is the effect that warpage becomes difficult (part described as "high preferred orientation" in FIG. 10). This is the effect of high preferred orientation. On the other hand, in the case of formula (3-2), that is, if $r_{max}\geq 20$, it means that the ratio of diffraction intensities is approaching greater randomness. By the microstructure becoming random, there is the effect of suppression of loss of the balance of residual stress after etching (notation "randomization" in FIG. 10). For this reason, in the case of formula (2), there is the effect that warpage becomes difficult.

Fourth Embodiment

Next, a fourth embodiment will be explained in detail.

In general, it is known that there are differences in the etching rate due to the crystal orientations. If a material is not strongly oriented in a specific orientation, it is uniformly etched. If a material has a preferred orientation, a preferred orientation is easily etched with priority or becomes difficult to etch, so the etching becomes non-uniform and the etching precision falls.

The metal mask material is an Fe—Ni-based alloy. The major crystal planes are the (111), (200), (220), and (311) planes. Therefore, thinking that the respective diffraction intensities of the (111), (200), (220), and (311) planes are related to the distribution of uniform strain in the thickness direction, the inventors engaged in intensive research on the relationship of the respective diffraction intensities of the (111), (200), (220), and (311) planes of the metal mask material and the amount of warpage after half etching.

The inventors investigated in depth the relationship between the degree of orientation of the different orientations and the etching ability. As a result, they discovered that if the diffraction intensity of the (200) plane is a constant range or more, the diffraction intensity of the (311) plane is a certain range or less, and the total diffraction intensity of the (200) plane and (220) plane is a constant value or more, a good etching ability is exhibited. That is, they discovered that to uniformly and precisely etch a metal mask material, it is sufficient to use a material having diffraction intensities satisfying the following formula (4-1) to formula (4-3). Furthermore, they discovered that if even one or more requirements is not satisfied for the following formula (4-1) to formula (4-3), the etching rate becomes partially non-uniform and the etching precision deteriorates. The fourth embodiment is based on this finding:

$$0.385\leq I_{200}/\{I_{111}+I_{200}+I_{220}+I_{311}\} \tag{4-1}$$

$$I_{311}/\{I_{111}+I_{200}+I_{220}+I_{311}\}\leq 0.08 \tag{4-2}$$

$$0.93\leq \{I_{220}+I_{200}\}/\{I_{111}I_{200}+I_{220}+I_{311}\} \tag{4-3}$$

Relationship of Diffraction Intensities ($I_{111}$, $I_{200}$, $I_{220}$, $I_{311}$) and Amount of Warpage after Half Etching The relationship between the diffraction intensities of the {111}, {220}, {311}, and {220}, and planes of the metal mask material and the amount of warpage after half etching will be explained below:

As explained above, the respective diffraction intensities of the {111}, {200}, {220}, and {311} planes are considered to be related with the distribution of uniform strain in the thickness direction. Therefore, for the respective Samples "a" to "e" of Table 1, the relationship of the ratios of the diffraction intensities $I_{111}$, $I_{200}$, $I_{220}$, and $I_{311}$ when based on the total of the diffraction intensity $I_{111}$ at the {111} plane, the diffraction intensity $I_{200}$ at the {200} plane, the diffraction intensity $I_{220}$ at the {220} plane, and the diffraction intensity $I_{311}$ at the {311} plane and the amount of warpage was investigated as follows:

Further, the diffraction intensities $I_{111}$, $I_{200}$, $I_{220}$, and $I_{311}$ are respectively obtained using analysis software of the X-ray diffraction apparatus to remove the background from the X-ray diffraction peaks obtained by focusing method of X-ray diffraction and fitting the X-ray diffraction peaks after removal of background using a split Voigt function.

Further, the anticathode of the X-ray diffraction apparatus was Co, while the tube voltage and current at the time of measurement were respectively 40 kV and 135 mA.

Further, Samples "a" to "e" of the metal mask materials of Table 1 were respectively measured for values of r(1), r(2), and r(3) given by the following formulas:

$$r(1)=I_{200}/\{I_{111}+I_{200}+I_{220}+I_{311}\}$$

$$r(2)=I_{311}/\{I_{111}+I_{200}+I_{220}+I_{311}\}$$

$$r(3)=\{I_{220}+I_{200}\}/\{I_{111}+I_{200}+I_{220}+I_{311}\}$$

Further, Samples "a" to "e" of the metal mask materials of Table 1 were respectively measured for tensile strength (TS), then, in the same way as the first embodiment, were half etched and measured for amount of warpage. The results are shown in Table 5.

TABLE 5

| Sample | r(1) | r(2) | r(3) | Amount of warpage (mm) | TS (MPa) |
|---|---|---|---|---|---|
| a | 0.380964 | 0.084352 | 0.909884 | 5.8 | 755 |
| b | 0.651244 | 0.071955 | 0.922563 | 10.8 | 790 |
| c | 0.417181 | 0.064303 | 0.935697 | 4.5 | 856 |
| d | 0.45741 | 0.048518 | 0.951482 | 7.0 | 812 |
| e | 0.819455 | 0.045226 | 1.099269 | 1.7 | 719 |

Figure 11:
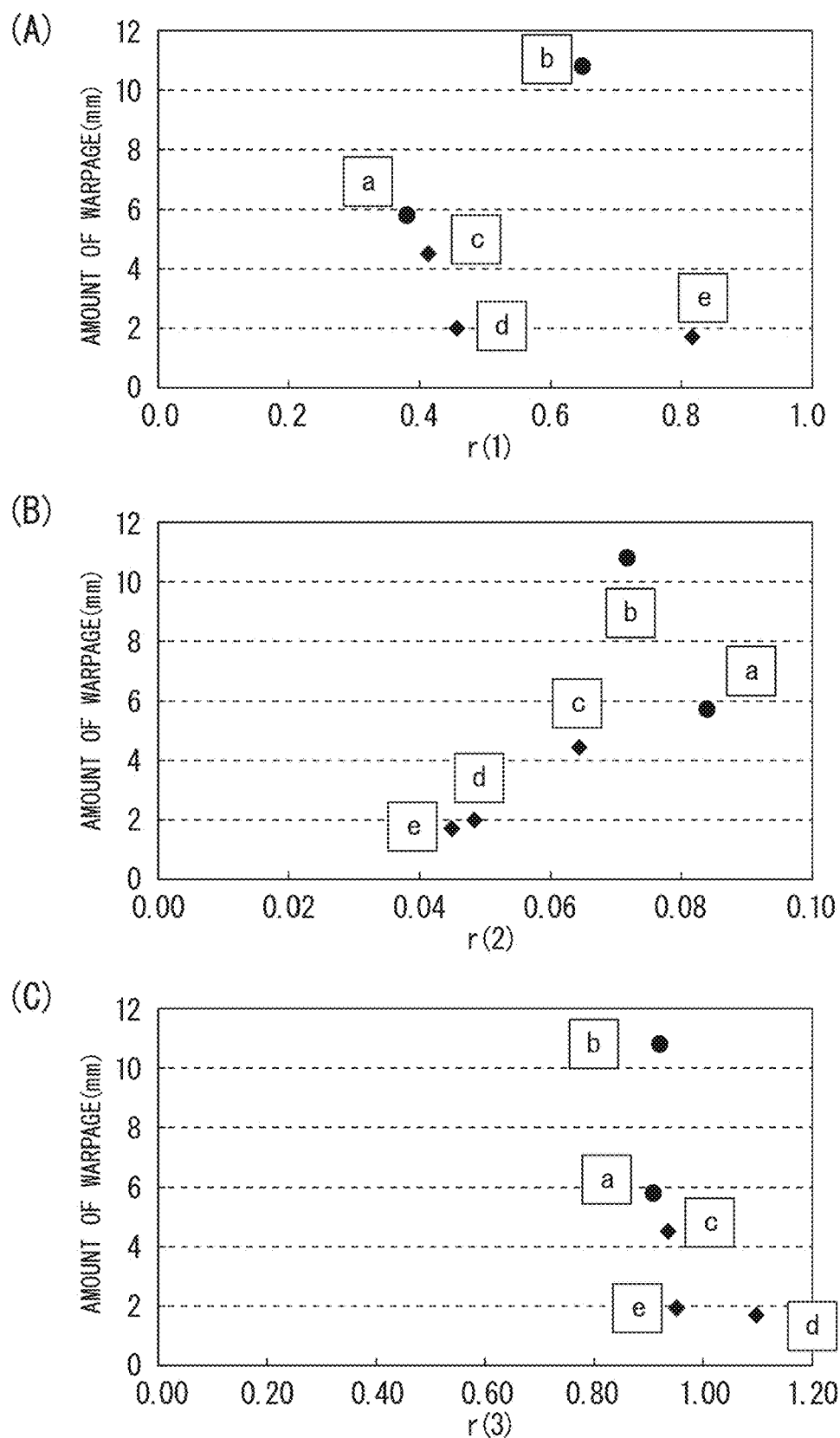
FIG. 11A is a graph showing a relationship of values of r(1) and amounts of warpage of manufacturing examples, 11B is a graph showing a relationship of values of r(2) and amounts of warpage of manufacturing examples, and 11C is a graph showing a relationship of values of r(3) and amounts of warpage of manufacturing examples,
FIGS. 12-1(a) and (b) are graphs plotting diffraction peak positions (2θ (deg)) of the {22} plane at Ψ angles and values of sin²Ψ at Ψ angles as coordinates on graphs having ordinates of the values of "2θ (deg)" and abscissas of the values of "sin²Ψ" using the focusing method for each of Samples "a" and "b" and the least square approximation lines of the same.

FIG. 11A is a graph showing the relationship between the value of r(1) and the amount of etching after half etching of the metal mask material. FIG. 11B is a graph showing the relationship between the value of r(2) and the amount of warpage after half etching of the metal mask material, and FIG. 11C is a graph showing the relationship between the value of r(3) and the amount of etching after half etching of the metal mask material. As shown in FIGS. 11A to 11C, it is learned that Samples "c" to "e" with amounts of warpage of 5.0 mm or less in each case satisfy the conditions of the following formulas (4-1) to (4-3):

$$0.385 \leq r(1) = I_{200}/\{I_{111}+I_{200}+I_{220}+I_{311}\} \tag{4-1}$$

$$r(2) = I_{311}/\{I_{111}+I_{200}+I_{220}+I_{311}\} \leq 0.08 \tag{4-2}$$

$$0.93 \leq r(3) = \{I_{220}+I_{200}\}/\{I_{111}+I_{200}+I_{220}+I_{311}\} \tag{4-3}$$

Fifth Embodiment

Next, a fifth embodiment will be explained in detail.

As explained above, the main crystal planes of the metal mask material are the (111), (200), (220), and (311) planes. Therefore, the inventors thought that the diffraction intensities of these crystal planes are related to the balance of the residual stress of the metal mask material.

When using the X-ray stress measurement technique to measure ($\sin^2\Psi$ method) the residual stress, since a low angle peak is affected by optical error etc., the residual stress is normally measured using a high angle diffraction peak. Therefore, the inventors engaged in intensive research on the relationship of the diffraction peak of the {220} plane of a metal mask material and the residual stress using the X-ray stress measurement technique ($\sin^2\Psi$ method).

As a result, they discovered that when measuring the residual stress using the X-ray stress measurement technique based on the diffraction peak of the {220} plane, the combination of not only the residual stress but also the calculated error is related with the amount of warpage after half etching. The fifth embodiment is based on this finding.

Relationship of Residual Stress Value and Error and Amount of Warpage

The relationship of the error σ of the residual stress value of the metal mask material and the amount of warpage after half etching will be explained below.

Each of Samples "a" to "e" of Table 1 was measured for residual stress value (R) under the conditions of Table 6 using the X-ray stress measurement technique ($\sin^2\Psi$ method).

First, the side-inclination method was used to measure the angle ($\Psi$ (deg)) formed by the normal direction of the sample surface and the {220} plane normal and the diffraction peak position (2θ (deg)) of the {220} plane at that angle $\Psi$.

Figure 12:
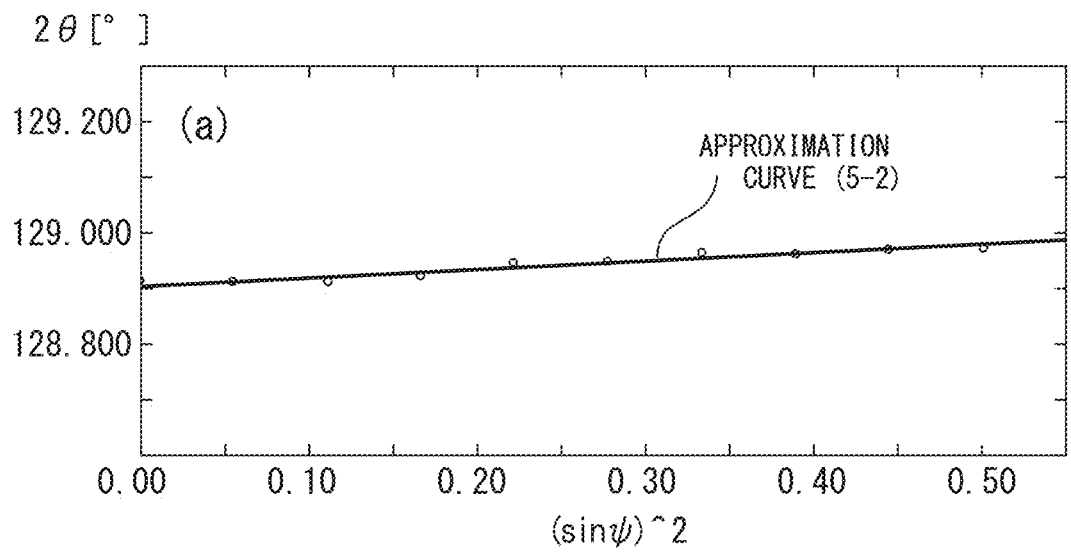
Figure 1:
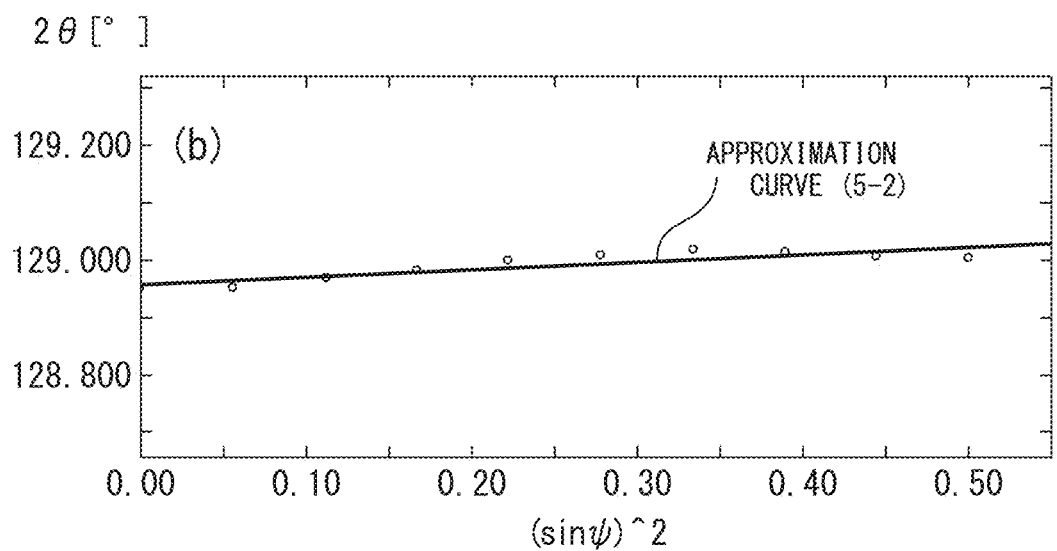

Next, the diffraction peak position (2θ (deg)) of the {220} plane at the angle $\Psi$ and the value of $\sin^2\Psi$ at that angle $\Psi$ were plotted as coordinates on a graph having an ordinate of the values of "2θ (deg)" and an abscissa of the values of "$\sin^2\Psi$". Graphs on which the coordinates are plotted are shown in FIG. 12-1 and FIG. 12-2 for each of the Samples "a" to "e".

The least square approximation line was found from all of the coordinates of the $\Psi$ angles. The slope of that line multiplied with the stress constant K was made the value of the stress. Further, the formula for calculation of the residual stress value (R) is shown in the following formula (5-2). The constants used for calculation of the residual stress value (R) are shown in Table 7. Further, the "approximation line (5-2)" of FIG. 12-1 and FIG. 12-2 is the least square approximation line defined by formula (5-2) in the graphs of the Samples "a" to "e".

$$R = \text{Slope} \times K = \text{Slope} \times \{-E/(2\times(1+v))\} \times \cot\theta_0 \times \pi/100 \tag{5-2}$$

The value of residual stress analyzed by the above-mentioned $\sin^2\Psi$ method and the error when calculating the value of residual stress using the formula (5-2) are shown for Samples "a" to "e" of Table 1 in Table 8. Further, the "error" is the error arising due to approximating by the least square method using formula (5-2) the relationship between the angle ($\Psi$ (deg)) formed by the normal direction of the sample surface and the {220} plane normal and the diffraction peak position (2θ (deg)) of the {220} plane at the angle $\Psi$ using the $\sin^2\Psi$ method. Further, each of Samples "a" to "e" of the metal mask materials of Table 1 was measured for tensile strength (TS), then was half etched in the same way as the first embodiment and measured for amount of warpage. The results are shown in Table 8.

TABLE 6

| Measurement apparatus | Micro-area X-ray residual stress measurement system AutoMATE2 made by Rigaku | |
|---|---|---|
| Measurement direction | C direction | |
| Sample preparation | None | |
| Optical system | Side inclination method | |
| Measurement conditions | Target/filter | Cr/V |
| | Tube voltage/tube current | 40 kV/40 mA |
| | Collimeter | One-dimensional semiconductor detector D/teX Ultra1000 |
| | Range of measured angle (2θ) | 2.0 mmΦ |
| | Swing, angle | 118.54° to 138.24° |
| | Measurement time | 30 sec |
| | Diffraction plane | {220} plane of γ-Fe |
| | $\Psi$ angle | $\Psi$ = 0, 13.6, 19.5, 24.1, 28.1, 31.8, 35.8, 38.6, 41.8, 45.0° |

TABLE 7

| Stress constant K | −519.06 MPa/deg |
|---|---|
| Young's modulus E | 150000 MPa |
| Poisson ratio v | 0.23 |
| Distortion-free diffraction angle $\theta_0$ | 128.8 deg |

TABLE 8

| Sample. | Residual stress value (MPa) | Error (MPa) | Amount of warpage (mm) | TS (MPa) |
|---|---|---|---|---|
| a | −80 | 7 | 5.8 | 755 |
| b | −66 | 14 | 10.8 | 790 |
| c | −111 | 7 | 4.5 | 856 |
| d | −84 | 6 | 2.0 | 812 |
| e | −55 | 20 | 1.7 | 719 |

If plotting the residual stress values (MPa) and errors (MPa) of the Samples "a" to "e" on a graph having an ordinate of the values of "error (MPa)" and an abscissa of the values of the "residual stress (MPa)", the result becomes as shown in FIG. 13. Samples "c", "d", and "e" had amounts of warpage of less than 5.0 mm and satisfied the following formula (5-1). As opposed to this, Samples "a" and "b" where the amount of warpage became over 5.0 mm did not satisfy (5-1). The metal mask material according to the fifth embodiment is based on this finding and is characterized by satisfying the following formula (5-1):

$$\sigma \leq \alpha + \beta \times R + \gamma \times R^2 \tag{5-1}$$

where, $\alpha=211.1$; $\beta=5.355$; $\gamma=0.034886$; the R in the above formula is the value of residual stress obtained by the $\sin^2\Psi$ method, and $\sigma$ is the error of the value of residual stress obtained by the $\sin^2\Psi$ method.

$\sigma$ can be calculated by the method disclosed in NPL 3. Specifically, as shown in the following formula, $\sigma$ may be calculated using the value of the confidence rate (1−k) in the "t" distribution having a degree of freedom of a natural number (n−2) of the number "n" of measurement points of the focusing X-ray stress measurement minus 2.

$$\text{Slope} = \frac{\sum_{i=1}^{n}(Xi-\overline{X})(Yi-\overline{Y})}{\sum_{i=1}^{n}(Xi-\overline{X})^2} = \frac{\sum_{i=1}^{n}XiYi - n\overline{X}*\overline{Y}}{\sum_{i=1}^{n}X_i^2 - n\overline{X}^2} \qquad \text{[Mathematical 4]}$$

$$\Delta M = t(n-2, k) * \sqrt{\frac{\sum_{i=1}^{n}\{Yi-(A+\text{Slope}*Xi)\}^2}{(n-2)\sum_{i=1}^{n}(Xi-\overline{X})^2}} \qquad \text{[Mathematical 5]}$$

where $Xi = \sin^2\psi i$; $Yi = 2\theta i$; $\overline{X} = \frac{1}{n}*\sum_{i=1}^{n} Xi$; $\overline{Y} = \frac{1}{n}*\sum_{i=1}^{n} Yi$; $A = \overline{Y} = \text{Slope}*\overline{X}$ [Mathematical 6]

In the above formula, t(n−2, k) is the value of the confidence rate (1−k) in the "t" distribution having a degree of freedom of a natural number (n−2) of the number "n" of measurement points of the focusing X-ray stress measurement minus 2. Further, in the present invention, the confidence rate (1−k) is preferably made 1 confidence interval.

If, in this way, for the Samples "a" to "e" of Table 1, the relationship of the residual stress value analyzed by the above-mentioned $\sin^2\Psi$ method and the error when analyzing the residual stress value using the $\sin^2\Psi$ method does not satisfy the formula (5-1), the metal mask material has an amount of warpage of over 5.0 mm.

Sixth Embodiment

Next, a sixth embodiment will be explained in detail.

As explained above, the major crystal planes of the metal mask material are the (111), (200), (220), and (311) planes. Therefore, the inventors thought that the diffraction intensities of these crystal planes were related to the balance of residual stress of the metal mask material.

When using the X-ray stress measurement technique ($\sin^2\Psi$ method) to measure the residual stress, since a low angle peak is affected by optical error etc., the residual stress is normally measured using a high angle diffraction peak enabling measurement of the diffraction angle precisely. Therefore, the inventors engaged in intensive research on the relationship of the diffraction peak of the {220} plane of a metal mask material and the residual stress using the X-ray stress measurement technique($\sin^2\Psi$ method).

As a result, they discovered that if plotting the positions of diffraction peaks (2θ (deg)) of the {220} plane at the different Ψ angles and the values of $\sin^2\Psi$ at the Ψ angles as coordinates on a graph having an ordinate of the values of "2θ (deg)" and an abscissa of the values of "$\sin^2\Psi$", a distribution of stress in the depth direction would actually be obtained and that the parameters of the approximation formula of this graph are related to the amount of warpage after half etching.

Further, slack is inversely proportional to the moment of inertia of area. Taking note of this point, the inventors discovered that if dividing the parameters of the approximation formula by the moment of inertia of area of the metal mask material, it is possible to predict the amount of warpage after half etching without being greatly affected by fluctuations in thickness.

Relationship Between Error of Residual Stress Values and Amount of Warpage

The relationship between the error σ of the residual stress values of a metal mask material and amount of warpage after half etching will be explained below.

The residual stresses of the Samples "a" to "e" of Table 8 were respectively calculated by linear approximation of the coordinates respectively plotted in FIG. 12-1(a), (b) and FIG. 12-2(c) to (e).

However, in actuality, the plotted points go up and down. This is believed to be the distribution of residual stress in the depth direction. By the curve approximation of this, it is possible to quantitatively debate and compare the distribution of residual stress in the depth direction from the curve.

Figure 14:
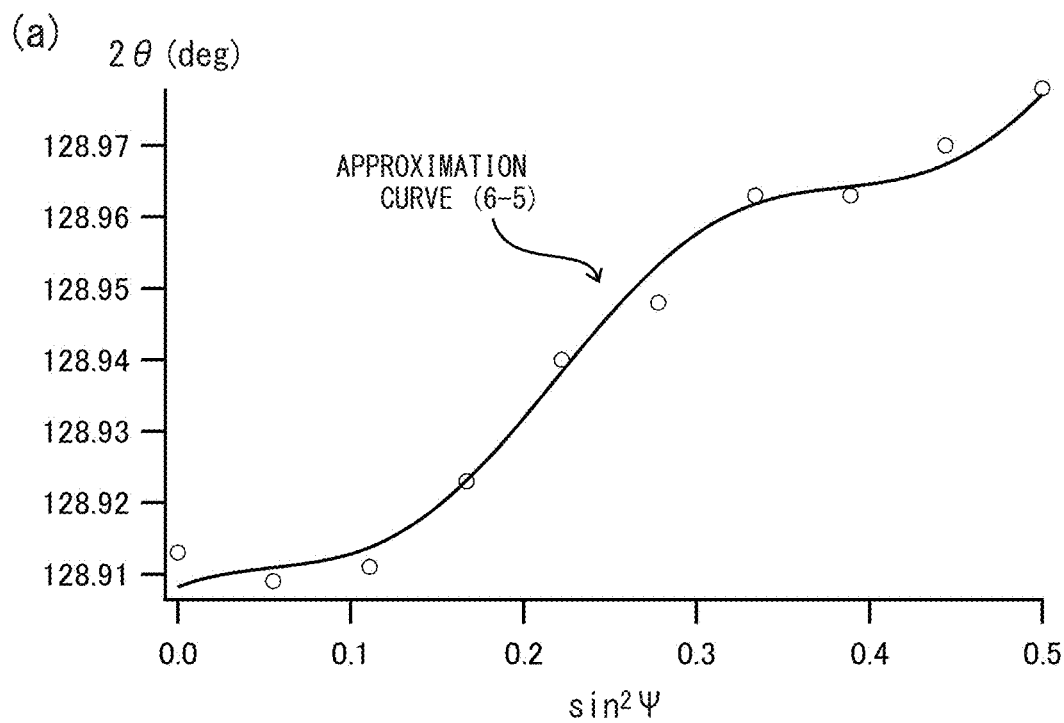
Figure 1:
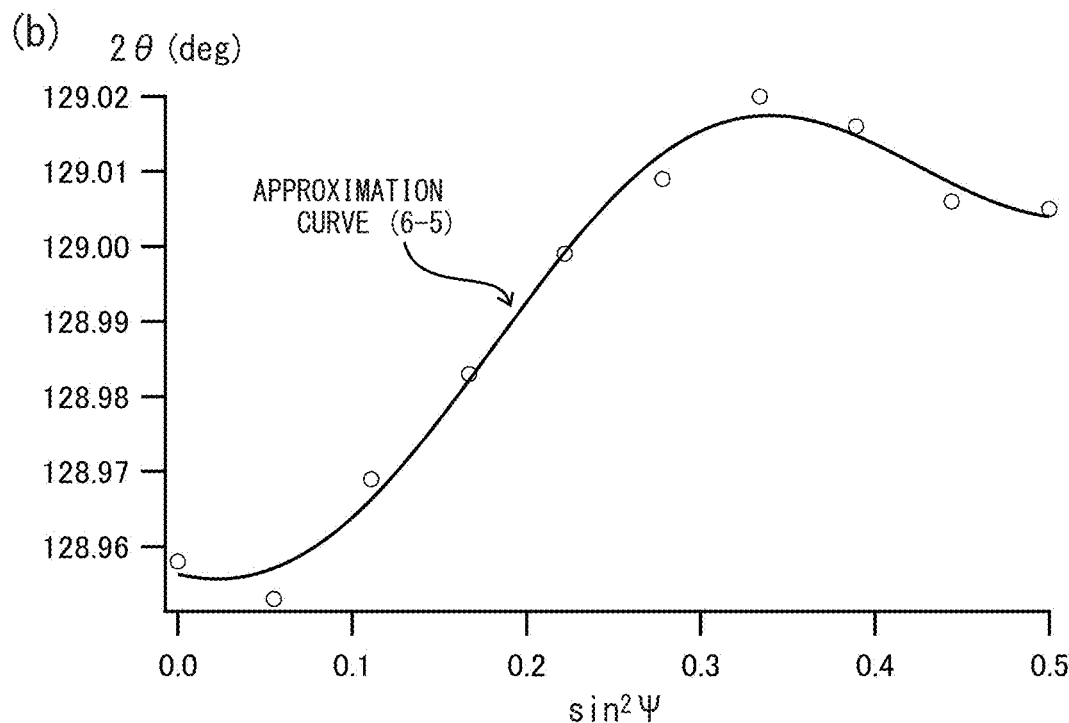

The fact that, as shown in FIG. 14-1 and FIG. 14-2, the coordinates platted at (a) and (b) of FIG. 12-1 and (c) to (e) of FIG. 12-2 respectively can be approximated by the following curve was discovered by the inventors. Further, the "approximation curve (6-5)" of FIG. 14-1 and FIG. 14-2 is the approximation curve defined by the following formula (6-5) in the graphs of the Samples "a" to "e". The values of the parameters "a" to "e" of the "approximation curve (6-5)" of FIG. 14-1 and FIG. 14-2 are as shown in Table 9.

$$2\theta = a + b \times \sin^2\Psi + c \times \sin(d \times \sin^2\Psi + e) \tag{6-5}$$

TABLE 9

| Sample | Parameters of approximation curve (1) | | | | | Warpage (mm) |
| | a (intercept) | b (slope) | c (amplitude) | d (frequency) | e (phase) | |
|---|---|---|---|---|---|---|
| a | 128.90 | 0.16155 | 0.0071 | 19.065 | −4.1846 | 5.8 |
| b | 128.97 | 0.09834 | 0.0171 | 12.846 | −2.3253 | 10.8 |
| c | 128.98 | 0.07277 | −0.0393 | 5.095 | 1.3180 | 4.5 |

TABLE 9-continued

| Sample | Parameters of approximation curve (1) | | | | | Warpage (mm) |
| --- | --- | --- | --- | --- | --- | --- |
| | a (intercept) | b (slope) | c (amplitude) | d (frequency) | e (phase) | |
| d | 128.91 | 0.01595 | 0.0312 | 6.949 | −1.7992 | 2.0 |
| e | 128.93 | 0.11034 | 0.0215 | 13.509 | −1.7322 | 1.7 |

Figure 15:
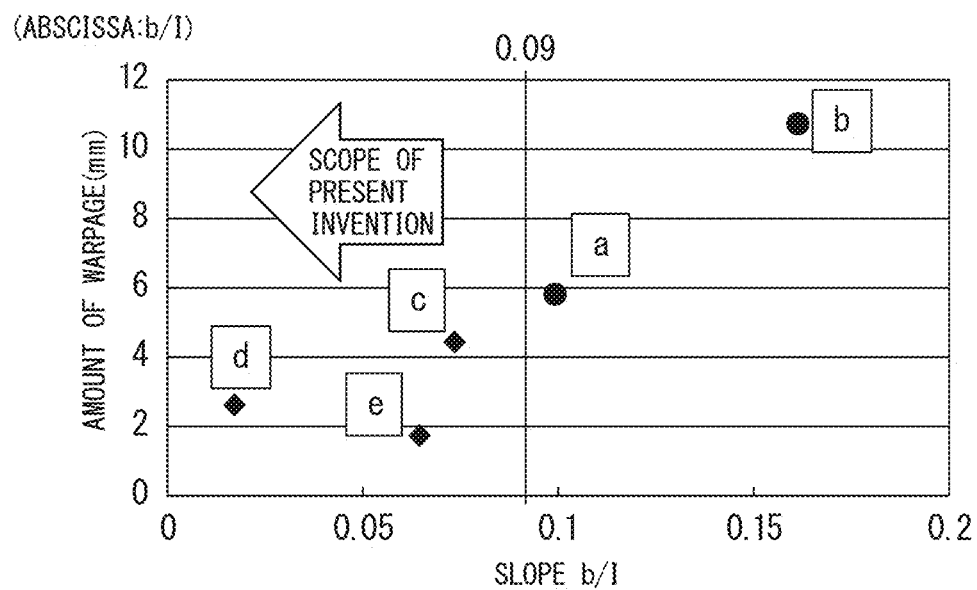
Figure 1:
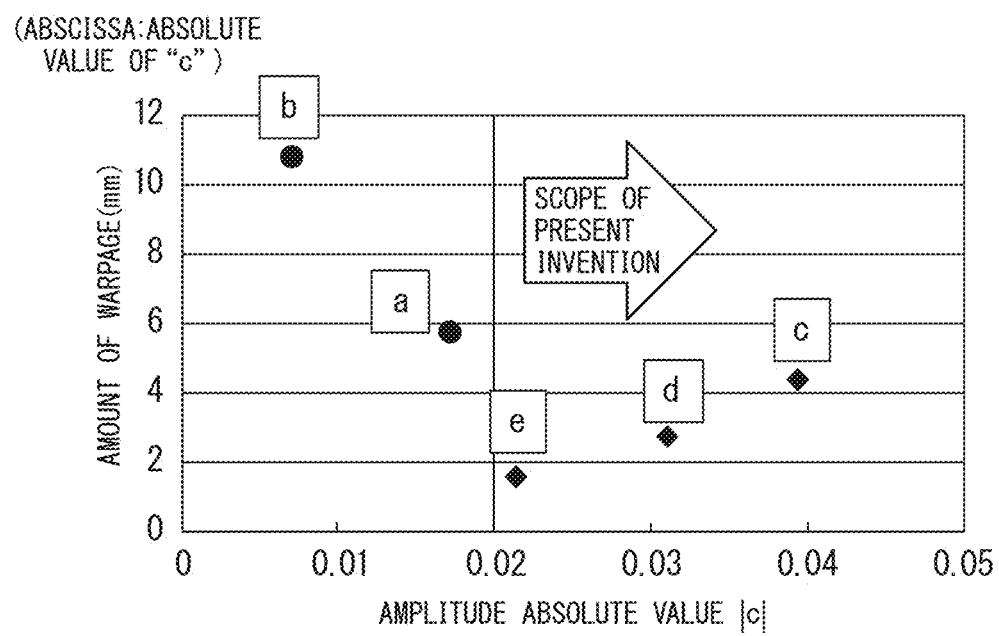
Figure 15:
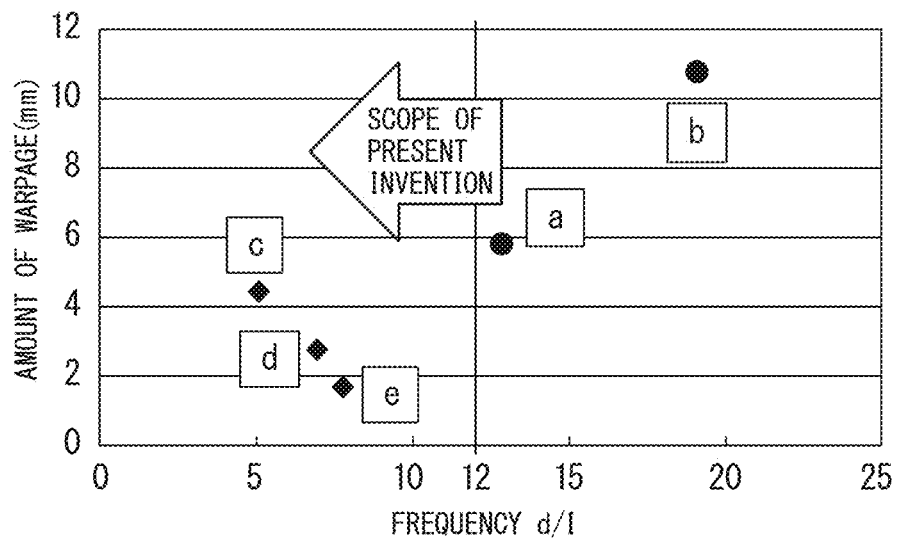
Figure 2:
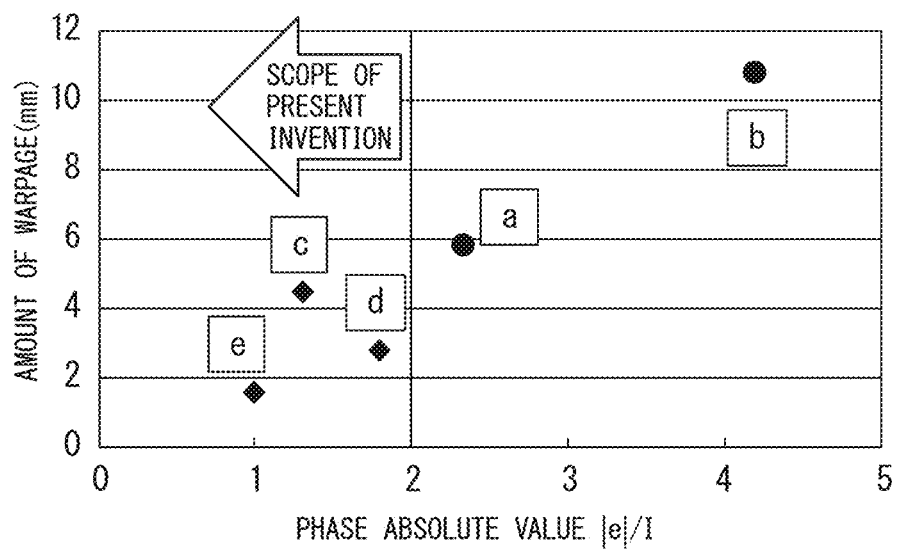

FIG. 15-1 and FIG. 15-2 show the relationship between the amount of warpage after half etching and the parameters "b" to "e". As will be understood from these graphs, when the parameters "b" to "e" of the approximation curve (6-5) satisfy the following conditions (6-1) to (6-4), the amount of warpage after the half etching becomes 5.0 mm. Further, I is a parameter proportional to the moment of inertia of area in the case where the cross-sectional shape is a rectangle. The value of "z" is determined and used as a standard so that I=1 at t=25 μm. Further, the value of the parameter I of the Sample "e" is 1.728.

$$b/I \leq 0.09 \quad (6\text{-}1)$$

$$0.02 \leq |c| \quad (6\text{-}2)$$

$$d/I \leq 12 \quad (6\text{-}3)$$

$$2 \geq |e|/I \quad (6\text{-}4)$$

where, $I=(z \times t^3)/12$
t: sample thickness (μm)
z: 0.000768

The metal mask material according to the sixth embodiment is based on such a finding and is characterized by the "b", "c", "d", and "e" of the following (6-5) satisfying the following conditions (6-1) to (6-4).

$$b/I \leq 0.09 \quad (6\text{-}1)$$

$$0.02 \leq |c| \quad (6\text{-}2)$$

$$d/I \leq 12 \quad (6\text{-}3)$$

$$2 \geq |e|/I \quad (6\text{-}4)$$

$$2\theta = a + b \times \sin 2\Psi + c \times \sin(d \times \sin 2\Psi + e) \quad (6\text{-}5)$$

where,
$I=(z \times t^3)/12$
t: thickness (μm)
z: 0.000768

Formula (6-5) is the approximation curve when making the abscissa the sin 2Ψ and the ordinate 2θ (deg) using the data on the diffraction peak position (2θ (deg)) of the {220} plane at the angle Ψ formed by the plane normal and the {220} plane normal obtained by measurement of the X-ray residual stress by the conditions of Table 6. The approximation curve is found by the least square method.

Thickness of Oxide Film

The metal mask material of the present invention including the above-mentioned first embodiment to sixth embodiment preferably has a thickness of the oxide film measured by Auger electron spectrometry of 4.5 nm or less. Here, the "thickness of the oxide film measured by Auger electron spectrometry" means the depth position where the oxygen concentration detected by the Auger electron spectrometry in the depth direction from the surface of the metal mask material (depth position 0) becomes ½ of the maximum value. The depth from the surface is obtained by conversion from the product of the sputtering rate and the sputtering time. The sputtering rate is obtained by using standard samples of silicon thermal oxide films of known oxide film thicknesses, performing ion sputtering by an ion gun of the Auger electron spectrometer used, deeming the point of time when the oxygen concentration becomes ½ as the time when the interface of the $SiO_2$ and Si was reached, and calculating the rate from the known oxide film thickness and time the interface was reached.

If the oxide film thickness measured by Auger electron spectrometry is over 4.5 nm, the productivity at the time of etching falls and the etching precision drops, so this is unsuitable. On the other hand, by making the oxide film thickness 4.5 nm or less, the productivity at the time of etching rises and the etching precision also becomes better, so this is optimal on that point. The thinner the oxide film thickness the more preferable, but completely eliminating the oxide film is difficult, so the oxide film thickness may be 0.5 nm or more. The oxide film thickness is preferably 3.0 nm or less, more preferably 2.8 nm or less.

0.2% Yield Strength

The 0.2% yield strength of the metal mask material of the present invention and the metal mask of the present invention is preferably 330 MPa or more and 850 MPa or less. Note that, the 0.2% yield strength is a value measured at ordinary temperature. If the 0.2% yield strength is less than 330 MPa, there is a possibility of wrinkles and folds occurring due to the etching process and the handling in transport and causing the problem of a drop in productivity. Note that, the 0.2% yield strength of steel foil is measured based on a test method based on the tensile test method for metal materials prescribed in JIS Z2241. The shape of the test piece is made No. 13B and the tensile direction is made the rolling direction. It is not particularly necessary to set an upper limit on the 0.2% yield strength from the viewpoint of preventing wrinkles and folds in the steel foil. However, if considering the ease of handling and the stability when obtaining strength by work hardening by industrial rolling or the correlation with warpage after etching, 850 MPa, is the substantive upper limit of the 0.2% yield strength of steel foil.

Average Arithmetic Surface Roughness

Further, the metal mask material of the present invention preferably has an average arithmetic surface roughness Ra in a direction perpendicular to the rolling direction of 0.02 μm or more and 0.10 μm or less. When coating a resist before etching, a fine surface roughness makes the adhesion of the resist and material better and makes penetration of the etching solution to nonetching locations difficult. For this reason, it becomes possible to keep down any variation in dimensions of parts after etching. To adjust Ra to 0.02 μm or more and 0.10 μm or less, the method can be used of using a roll with a roll surface roughness Ra of 0.01 μm or more and 0.30 μm or less in a direction perpendicular to the circumferential direction and cold rolling by a rolling rate of 1.5 m/s or more.

Method for Manufacturing Metal Mask Material of Present Invention

An embodiment relating to the method for manufacturing the metal mask material of the present invention will be explained. However, the method for manufacturing the same is not intended to be limited to the method of manufacturing according to the seventh embodiment shown below.

Seventh Embodiment

First, the raw materials are melted in a vacuum atmosphere of a vacuum degree of $10^{-1}$ (Torr) or less to obtain a melt of the composition of the metal mask material targeted. At that time, Mn, Si, Mg, Al, or other deoxidizers are added to raise the cleanliness of the melt, then the melt is cast into a slab. Further, the casting process of the slab may be made a process where an Fe—Ni alloy having the above-mentioned steel composition is melted in an electric furnace, the melt is refined, then continuous casting is used to manufacture a slab of a thickness of 150 mm to 250 mm. Further, the casting process may also be performed by electro slag remelting or vacuum electro slag remelting.

The slab of the metal mask material is hot forged to manufacture a slab. The slab is hot rolled until 3.0 mm to 200 mm thickness, then coiled (coiling process). The hot coil is alternately cold rolled and annealed to be formed into a metal mask material having a thickness of 5.00 μm or more and 50.00 μm or less. The temperatures in the hot forging process and hot rolling process are temperatures of less than the melting point of the metal mask material for preventing aggregation of the inclusions and preferably are made ranges of the melting point temperature of the metal mask material minus 500° C. or more and the melting point temperature of the metal mask material minus 200° C. or less.

The number of times and rolling reductions of the cold rolling are not particularly limited, but the rolling is preferably performed so that the rolling reduction of the final rolling process becomes in the range of 30.0% or more and 95.0% or less. Further, in a plurality of cold rolling processes, it is preferable to lower the rolling reductions toward the final rolling. The warpage after etching is believed to be due to the residual strain inside the material introduced due to the rolling. In such residual strain, the strain introduced by the cold rolling is released by the annealing process after cold rolling, in particular the final annealing process. For this reason, the material is preferably held in the temperature range of 300 to 900° C. for 4.0 seconds or more after the cold rolling. The preferable temperature range of the final annealing process is 650 to 900° C.

The length of time held in this temperature range, the rate of temperature rise, and the cooling rate are not particularly limited, but preferably this is performed in a hydrogen, carbon monoxide, and hydrocarbon ($CH_4$, $C_3H_8$ etc.) gas or other reducing atmosphere to reduce the thickness of the oxide film.

By suitably adjusting the rolling reductions of each pass and the rolling reduction of the final rolling and final annealing temperature to within the above-mentioned ranges, it is possible to manufacture at least one of the metal mask materials of the above-mentioned first embodiment to sixth embodiment.

Metal Mask of Present Invention

The metal mask material of the present invention is reduced in amount of warpage due to etching, so the metal mask material according to the present invention enables high precision etching. A metal mask manufactured using this material is suitably used for manufacturing high definition resolution OLEDs etc.

Method for Manufacturing Metal Mask of Present Invention

The method for manufacturing the metal mask of the present invention can make use of general methods and is not particularly limited. That is, a resist is formed on both surfaces of the metal mask material of the present invention, then exposed and developed. Next, one surface is etched, then the resist is removed and a nonetched protective layer is formed. After that, the other surface is wet etched in the same way as the above, then the resist removed whereby a metal mask part is obtained. Furthermore, a frame can be welded to the above metal mask part according to need. As the resist, etching solution, and protective layer, general ones can be applied. Specifically, for the resist, a technique selected from attachment of a dry film, coating of a photosensitive material, etc. can be used. For the etching solution, a technique of dipping in or spraying a ferric chloride solution or other acidic solution can be applied. The protective layer need only be one having chemical resistance to the above etching solution.

EXAMPLES

Below, examples of the present invention will be shown, but these are provided for better understanding the present invention. They are not intended to limit the present invention.

Example 1

Under the conditions of Tables 10 and 11, the rolling reduction of the cold rolling and the annealing temperature were adjusted to manufacture the metal mask materials of Sample Nos. 1 to 6. The compositions of elements described in Table 10 are compositions of the metal mask materials of Sample Nos. 1 to 6. The "CC" in Table 10 shows that the slabs were manufactured by continuous casting. Further, the final annealing was performed by heat treatment in a hydrogen gas atmosphere for 4.0 seconds or more.

TABLE 10

| Sample no. | Composition of slab of metal mask material (mass %) | | | | | | | | | | Method of manufacture of slab | Remarks |
|---|---|---|---|---|---|---|---|---|---|---|---|---|
| | Ni | Co | C | Ca | Si | Mn | Al | Mg | P | S | | |
| 1 | 35.7 | 0.28 | 0.013 | <0.0001 | 0.04 | 0.32 | 0.027 | 0.0002 | 0.007 | 0.0004 | CC | Comp. ex. |
| 2 | 35,6 | 0.03 | 0.014 | <0.0001 | 0.05 | 0.29 | <0.001 | <0.0001 | 0.002 | 0.0003 | CC | Inv. ex. |
| 3 | 36.1 | 0.04 | 0.015 | <0.0001 | 0.05 | 0.31 | <0.001 | <0.0001 | 0.003 | 0.0003 | CC | Inv. ex. |
| 4 | 35.9 | 0.06 | 0.017 | <0.0001 | 0.04 | 0.30 | <0.001 | <0.0001 | 0.004 | 0.0003 | CC | Inv. ex. |
| 5 | 35.2 | 0.42 | 0.005 | <0.0001 | 0.02 | 0.25 | <0.001 | <0.0001 | 0.003 | 0.0014 | CC | Inv ex. |
| 6 | 35.8 | 0.02 | 0.016 | <0.0001 | 0.06 | 0.27 | <0.001 | <0.0001 | 0.002 | 0.0005 | CC | Inv. ex. |

TABLE 11

| Sample no. | Sheet thickness (μm) | Rolling reduction of final rolling (%) | Final annealing temperature (° C.) | Holding time (sec) | Remarks |
|---|---|---|---|---|---|
| 1 | 25 | 91.7 | 650 | 4.8 | Comp. ex. |
| 2 | 25 | 91.7 | 700 | 4.8 | Inv. ex. |
| 3 | 25 | 91.7 | 750 | 4.8 | Inv. ex. |
| 4 | 25 | 91.7 | 800 | 4.8 | Inv. ex. |

TABLE 11-continued

| Sample no. | Sheet thickness (μm) | Rolling reduction of final rolling (%) | Final annealing temperature (° C.) | Holding time (sec) | Remarks |
|---|---|---|---|---|---|
| 5 | 25 | 91,7 | 850 | 4.8 | Inv. ex. |
| 6 | 25 | 91,7 | 900 | 4.8 | Inv. ex. |

Figure 17:
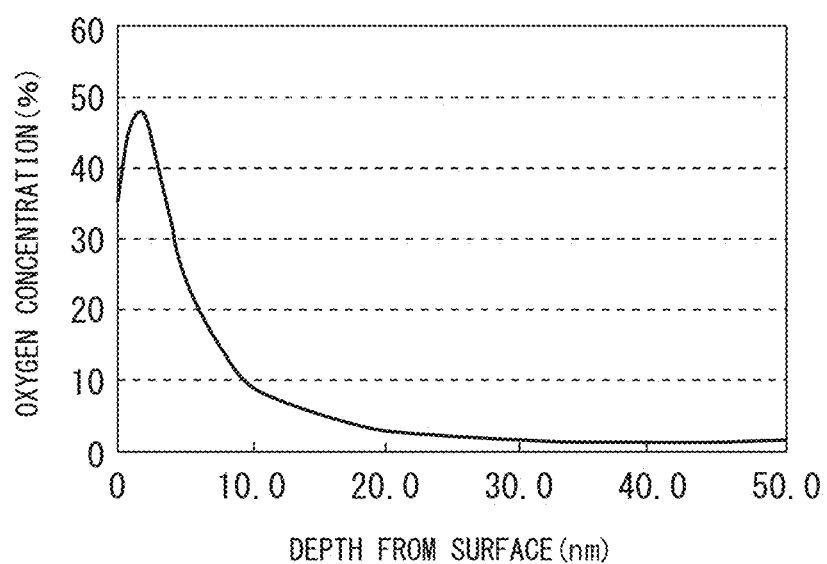
FIG. 17 is a graph showing a depth profile of oxygen concentration from a surface of a metal mask material measured using an Auger electron spectrometer.
Figure 18:
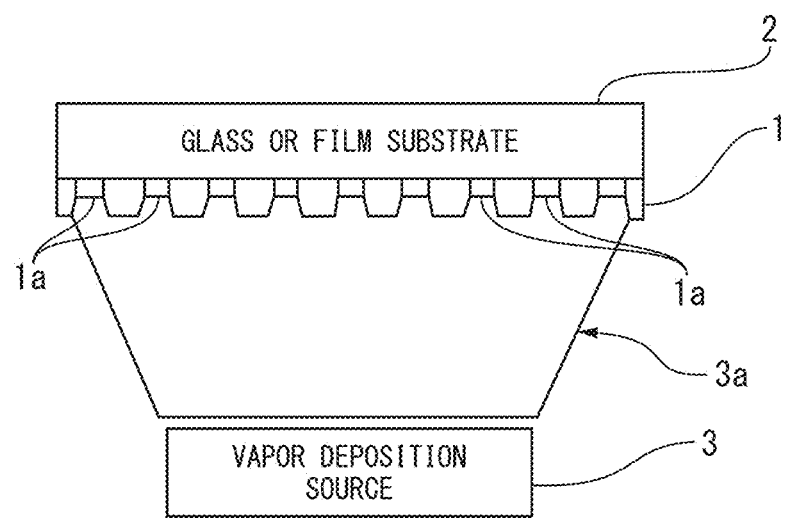
FIG. 18 is a schematic explanatory view showing a process of vapor deposition of an organic EL luminescent material on a substrate and a state of use of a metal mask in that process.

An Auger electron spectrometer (made by Ulvac-Phi: model SAM670X) was used to measure the oxide film thicknesses of the metal mask materials of Sample Nos. 1 to 6. The samples had depth profiles of oxygen concentration such as shown in FIG. 17. In the depth profiles of oxygen concentration of Sample Nos. 1 to 6, the depths at which the oxygen concentration became ½ the maximum value of the oxygen concentration were deemed the oxide film thicknesses of the samples.

Figure 16:
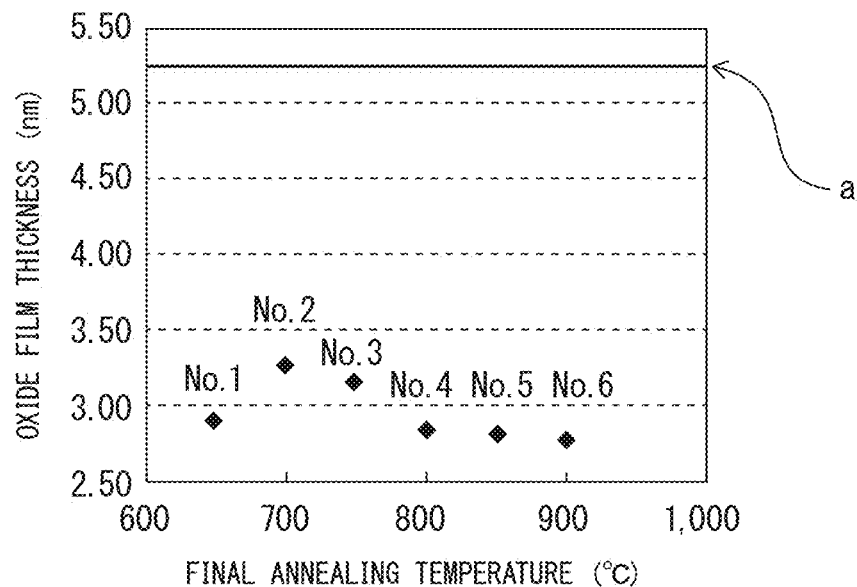
FIG. 16 is a graph showing a relationship of final annealing temperatures of metal mask materials of manufacturing examples and thicknesses of an oxide film.

The oxide film thicknesses of the metal mask materials of the invention examples, as shown in FIG. 16, were less than 3.5 nm. Each of these Sample Nos. 1 to 6 was cut into 100 mm square, one surface of the cut sample was covered by a resist, then the sample was dipped in a ferric chloride aqueous solution until the thickness became ⅖ to thereby half etch it. The amounts of warpage of Sample Nos. 2 to 6 were in each case 5.0 mm or less. As opposed to this, Sample No. 1 had an amount of warpage of over 5.0 mm. The results of measurement of the amounts of warpage are shown in Table 11. Further, the notation "a" of FIG. 16 shows the results of measurement of the oxide film thickness of the oxide film thickness of Sample "a" of Table 1. However, the final annealing temperature (° C.) of Sample "a" is 500° C. The oxide film thickness of Sample No. 1 was 2.9 nm, while the oxide film thicknesses of Sample Nos. 4 to 6 were 2.8 nm or less.

Each of Sample Nos. 1 to 6 was measured for average lattice constant of the bulk by the focusing method. The measurement results were used to calculate the average {111} lattice spacing $D_L$ (units: nm). Specifically, for each of Sample Nos. 1 to 6, the focusing method was performed and the average lattice constant of the bulk was measured. Next, the value of the Nelson-Riley function $\frac{1}{2} \times \{\cos^2\theta/\sin^2\theta + (\cos^2\theta)/\theta\}$ was calculated from the diffraction angle (2θ) in the focusing method. The obtained value was plotted on the x-axis and the average {111} lattice spacing obtained from the Bragg' low was plotted on the y-axis. Next, the value of the y-intercept of the line obtained by the least square method was found. This value was made the average {111} lattice spacing ($D_L$) plane calculated from the average lattice constant of the bulk. The thus calculated $D_L$ of Sample Nos. 1 to 6 was 0.20762 nm.

Further, each of Sample Nos. 1 to 6 was measured for the average {111} lattice spacing by the grazing incidence X-ray diffraction technique. The value of AD defined by the following formula (1-2) was calculated.

$$\Delta D = |D_M - D_L| \quad (1\text{-}2)$$

where, $D_M$ is the average lattice spacing (units: nm) of the {111} plane from 1.45 μm to 7.11 μm below the surface obtained by the grazing incidence X-ray diffraction technique.

Sample Nos. 2 to 6 had average {111} lattice spacings from 1.45 μm to 7.11 μm below the surface satisfying the formula (1-1):

$$\Delta D \le 0.00030 \quad (1\text{-}1)$$

Further, the results of measurement of |ΔD|, $D_M$, tensile strength (TS), yield strength (YS), and amount of warpage of half etching of Sample Nos. 1 to 6 are shown in Table 12. Further, the yield strength (YS) of Table 12 is the 0.2% yield strength measured based on the test method based on the tensile test methods for metal materials prescribed in JIS Z2241.

TABLE 12

| Sample no. | TS (MPa) | YS (MPa) | Ra (μm) | $D_M$ (nm) | |ΔD| (nm) | Amount of warpage (mm) | Remarks |
|---|---|---|---|---|---|---|---|
| 1 | 861 | 845 | 0.09 | 0.207306 | 0.000314 | 7.0 | Comp. ex. |
| 2 | 845 | 828 | 0.03 | 0.207341 | 0.000279 | 5.0 | Inv. ex. |
| 3 | 812 | 788 | 0.05 | 0.207428 | 0.000192 | 2.0 | Inv. ex. |
| 4 | 756 | 723 | 0.08 | 0.207454 | 0.000166 | 2.0 | Inv. ex. |
| 5 | 512 | 412 | 0.02 | 0.207482 | 0.000138 | 1.0 | Inv. ex. |
| 6 | 428 | 345 | 0.06 | 0.207514 | 0.000106 | 1.0 | Inv. ex. |

Example 2

Each of Sample Nos. 1 to 6 of Table 10 and Table 11 was measured for the average full width at half maximum (FWHM) of the {111} plane ($H_{w111}$) from 1.45 μm to 7.11 μm below the surface using the grazing incidence X-ray diffraction technique and the value of the following formula $X(H_{w111},t)$ was found. Further, each of Sample Nos. 1 to 6 was measured for tensile strength (TS), yield strength (YS), and amount of warpage after half etching. These measurement results are shown in Table 13. Further, the yield strength (YS) of Table 13 is the 0.2% yield strength measured based on the test method based on the tensile test methods for metal materials prescribed in JIS Z2241. Sample Nos. 2 to 6 had amounts of warpage after half etching of 5.0 mm or less, while Sample Nos. 3 to 6 had average FWHM of the {111} plane from 1.45 μm to 7.11 μm below the surface satisfying the following formula (2-1).

$$X(H_{w111},t) = H_{w111}/\sqrt{t/25} \le 0.545 \quad (2\text{-}1)[\text{Mathematical 7}]$$

TABLE 13

| Sample no. | TS (MPa) | YS (MPa) | Ra (μm) | Value of X ($H_{w111}$, t) | Amount of warpage (mm) | Remarks |
|---|---|---|---|---|---|---|
| 1 | 861 | 845 | 0.09 | 0.552 | 7.0 | Comp. ex. |
| 2 | 845 | 828 | 0.03 | 0.547 | 5.0 | Inv. ex. |
| 3 | 812 | 788 | 0.05 | 0.530 | 2.0 | Inv. ex. |
| 4 | 756 | 723 | 0.08 | 0.529 | 2.0 | Inv. ex. |
| 5 | 512 | 412 | 0.02 | 0.528 | 1.0 | Inv. ex. |
| 6 | 428 | 345 | 0.06 | 0.527 | 1.0 | Inv. ex. |

Example 3

Each of Sample Nos. 1 to 6 of Table 10 and Table 11 was measured for the integrated intensity $I_{111}$ of the {111} plane from 1.45 µm to 7.11 µm below the surface and the integrated intensity $I_{200}$ of the {200} plane using the grazing incidence X-ray diffraction technique to find the ratio "r" (=$I_{111}/I_{200}$) of the integrated intensity $I_{111}$ of the {111} plane with respect to the integrated intensity $I_{200}$ of the {200} plane. The maximum value $r_{max}$ in the integrated intensity ratios "r" is shown in Table 14. Further, each of Sample Nos. 1 to 6 was measured for tensile strength (TS), yield strength (YS), and amount of warpage after half etching. These measurement results are shown in Table 14. Further, the yield strength (YS) of Table 14 is the 0.2% yield strength measured based on the test method based on the tensile test methods for metal materials prescribed in JIS Z2241.

Sample Nos. 2 to 6 had $r_{max}$ satisfying either of the following formula (3-1) or (3-2):

$$r_{max} < 9.5 \quad (3\text{-}1);$$

$$r_{max} \geq 20 \quad (3\text{-}2)$$

TABLE 14

| Sample no. | TS (MPa) | YS (MPa) | Ra (µm) | $r_{max}$ | Amount of warpage (mm) | Remarks |
|---|---|---|---|---|---|---|
| 1 | 861 | 845 | 0.09 | 9.584 | 7.0 | Comp. ex. |
| 2 | 845 | 828 | 0.03 | 74.332 | 5.0 | Inv. ex. |
| 3 | 812 | 788 | 0.05 | 74.599 | 2.0 | Inv. ex. |
| 4 | 756 | 723 | 0.08 | 74.653 | 2.0 | Inv. ex. |
| 5 | 512 | 412 | 0.02 | 74.706 | 1.0 | Inv. ex. |
| 6 | 428 | 345 | 0.06 | 74.759 | 1.0 | Inv. ex. |

Example 4

Each of Sample Nos. 1 to 6 of Table 10 and Table 11 was measured for the respective diffraction intensities of the {111}, {200}, {220}, and {311} plane by the focusing method. Further, the measurement results were used to find the respective values of r(1) to r(3) defined by the above-mentioned formulas.

The respective values of r(1), r(2), and r(3) of Sample Nos. 1 to 6 are shown in Table 15. Further, each of Sample Nos. 1 to 6 was measured for tensile strength (TS), yield strength (YS), and amount of warpage after half etching. These measurement results are shown in Table 15. Further, the yield strength (YS) of Table 15 is the 0.2% yield strength measured based on the test method based on the tensile test methods for metal materials prescribed in JIS Z2241. Sample Nos. 2 to 6 all satisfied the above-mentioned formula (4-1) to formula (4-3).

Example 5

Each of Sample Nos. 1 to 6 of Table 10 and Table 11 was measured for the angle (Ψ (deg)) formed by the normal direction of the sample surface and the normal of the {220} plane and the diffraction peak position (2θ (deg)) of the {220} plane at the angle Ψ under the conditions of Table 6 using the X-ray stress measurement technique. Next, on a graph having an ordinate of the value of "2θ (deg)" and an abscissa of a value of "$\sin^2\Psi$", the diffraction peak positions (2θ (deg)) of the {220} plane at the Ψ angles and the values of $\sin^2\Psi$ at the Ψ angles were plotted as coordinates. The least square approximation line was found from all of the coordinates of the Ψ angles and the value of the residual stress was measured using the X-ray stress measurement technique ($\sin^2\Psi$ method). Further, the error arising due to approximation using a least square approximation line was calculated. The measured values of the residual stress and the error of the same are shown in Table 16. Further, as the constants used for calculation of the residual stress values, the values shown in Table 7 were used.

Further, each of Sample Nos. 1 to 6 was measured for tensile strength (TS), yield strength (YS), and amount of warpage after half etching. These measurement results are shown in Table 16. Further, the yield strength (YS) of Table 18 is the 0.2% yield strength measured based on the test method based on the tensile test methods for metal materials prescribed in HS Z2241.

For each of Sample Nos. 1 to 6, the Y value found by the following formula was calculated. The calculated Y value and the error σ of the residual stress value R obtained by the focusing X-ray stress measurement technique were compared. The error σ, as explained above, was calculated using the value of the distribution of "t" for 1 confidence interval in a "t" distribution having a degree of freedom of a natural number of the number "n" of measurement points of the focusing X-ray stress measurement technique minus 2.

$$Y = \alpha + \beta \times R + \gamma \times R^2$$

where, α=211.1; β=5.355; γ=0.034886, R in the formula is the value of residual stress obtained by the focusing X-ray stress measurement technique.

As shown in Table 16, the Y value of Sample No. 1 is smaller than the error σ, while the Y values of Sample Nos. 2 to 6 are larger than the error σ. That is, Sample No. 1 does not satisfy the formula (5-1), while Sample Nos. 2 to 6 satisfy the formula (5-1).

TABLE 15

| Sample no. | TS (MPa) | YS (MPa) | Ra (µm) | r(1) | r(2) | r(3) | Amount of warpage (mm) | Remarks |
|---|---|---|---|---|---|---|---|---|
| 1 | 861 | 845 | 0.09 | 0.369446 | 0.081722 | 0.890803 | 7.0 | Comp. ex. |
| 2 | 845 | 828 | 0.03 | 0.38665 | 0.074463 | 1.126192 | 5.0 | Inv. ex. |
| 3 | 812 | 788 | 0.05 | 0.602335 | 0.049267 | 1.12740 | 2.0 | Inv. ex. |
| 4 | 756 | 723 | 0.08 | 0.628966 | 0.047911 | 1.12783 | 2.0 | Inv. ex. |
| 5 | 512 | 412 | 0.02 | 0.732525 | 0.036225 | 1.128332 | 1.0 | Inv. ex. |
| 6 | 428 | 345 | 0.06 | 0.767474 | 0.034884 | 1.128636 | 1.0 | Inv. ex. |

TABLE 16

| Sample no. | TS (MPa) | YS (MPa) | Residual stress value (MPa) | Error σ (MPa) | Ra (μm) | Amount of warpage (mm) | Y value | Remarks |
|---|---|---|---|---|---|---|---|---|
| 1 | 861 | 845 | −90 | 18 | 0.09 | 7.0 | 11.73 | Comp. ex. |
| 2 | 845 | 828 | −101 | 7 | 0.03 | 5.0 | 26.12 | Inv. ex. |
| 3 | 812 | 788 | −94 | 6 | 0.05 | 2.0 | 15.98 | Inv. ex. |
| 4 | 756 | 723 | −75 | 4 | 0.08 | 2.0 | 5.71 | Inv. ex. |
| 5 | 512 | 412 | −69 | 5 | 0.02 | 1.0 | 7.70 | Inv. ex. |
| 6 | 428 | 345 | −60 | 9 | 0.06 | 1.0 | 15.39 | Inv. ex. |

Example 6

Each of Sample Nos. 1 to 6 of Table 10 and Table 11 was measured for the angle (Ψ (deg)) formed by the normal direction of the sample surface and the normal of the {220} plane and the diffraction peak position (2θ (deg)) of the {220} plane at the angle under the conditions of Table 6 using the X-ray stress measurement technique. Next, on a graph having an ordinate of the value of "2θ (den)" and an abscissa of a value of "$\sin^2\Psi$", the diffraction peak positions (2θ (deg)) of the {220} plane at the Ψ angles and the values of $\sin^2\Psi$ at the Ψ angles were plotted as coordinates. The least square approximation line was found from all of the coordinates of the Ψ angles and the values of the residual stress were measured using the X-ray stress measurement technique ($\sin^2\Psi$ method).

Further, the error arising due to approximation using the least square approximation line was calculated. The measured values of the residual stress and the error are shown in Table 18. The error σ, as explained above, was calculated using the value of the "t" distribution for 1 confidence interval in the "t" distribution having a degree of freedom of a natural number of the number "n" of measurement points of the X-ray residual stress minus 2. Further, as the constants used for calculation of the residual stress values, the values shown in Table 7 were used.

Further, each of Sample Nos. 1 to 6 was measured for tensile strength (TS), yield strength (YS), and amount of warpage after half etching. The measurement results are shown in Table 18. Further, the yield strength (YS) of Table 18 is the 0.2% yield strength measured based on the test method based on the tensile test methods for metal materials prescribed in JIS Z2241.

Further, for each of Sample Nos. 1 to 6, a graph of coordinates comprised of the diffraction peak positions (2θ (deg)) of the {220} plane at different Ψ angles and the values of $\sin^2\Psi$ at those Ψ T angles was approximated by a curve defined by formula (6-5). The parameters "a" to "e" of the approximation curve (6-5) relating to each of Sample Nos. 1 to 6 are as shown in Table 1. The parameters "a" to "e" of the Sample Nos. 2 to 6 satisfy formula (6-1) to formula (6-4). Further, the thicknesses of Sample Nos. 1 to 6 are 25 μm, so in each case, I=1.0.

TABLE 17

| Sample no. | Parameters of approximation curve (1) | | | | | |
|---|---|---|---|---|---|---|
| | a | b | c | d | e | |
| 1 | 128.93 | 0.12306 | 0.0071 | 19.065 | 3.5383 | Comp. ex. |
| 2 | 128.98 | 0.08201 | 0.0280 | 5.326 | 1.5647 | Inv. ex. |
| 3 | 128.94 | 0.03702 | 0.0321 | 5.320 | 1.1634 | Inv. ex. |
| 4 | 128.91 | 0.02564 | 0.0325 | 5.319 | 1.1496 | Inv. ex. |

TABLE 17-continued

| Sample no. | Parameters of approximation curve (1) | | | | | |
|---|---|---|---|---|---|---|
| | a | b | c | d | e | |
| 5 | 128.92 | 0.03212 | 0.0355 | 5.318 | 1.1495 | Inv. ex. |
| 6 | 128.90 | 0.02046 | 0.0358 | 5.316 | 1.1494 | Inv. ex. |

TABLE 18

| Sample no. | TS (MPa) | YS (MPa) | Ra (μm) | Residual stress value (MPa) | Error (MPa) | Amount of warpage (mm) | Remarks |
|---|---|---|---|---|---|---|---|
| 1 | 861 | 845 | 0.09 | −90 | 18 | 7.0 | Comp. ex. |
| 2 | 845 | 828 | 0.03 | −101 | 7 | 5.0 | Inv. ex. |
| 3 | 812 | 788 | 0.05 | −94 | 6 | 2.0 | Inv. ex. |
| 4 | 756 | 723 | 0.08 | −75 | 4 | 2.0 | Inv. ex. |
| 5 | 512 | 412 | 0.02 | −69 | 5 | 1.0 | Inv. ex. |
| 6 | 428 | 345 | 0.06 | −60 | 9 | 1.0 | Inv. ex. |

INDUSTRIAL APPLICABILITY

The metal mask material of the present invention is reduced in amount of warpage due to etching, so high precision etching is possible. The metal mask according to the present invention can be suitably used for manufacture of high definition resolution OLEDs.

REFERENCE SIGNS LIST

1 . . . metal mask
1a . . . mask holes
2 . . . substrate
3 . . . vapor deposition source of organic EL luminescent material
3a . . . organic EL luminescent material

The invention claimed is:

1. A metal mask material containing, by mass %, Ni: 35.0 to 37.0% and Co: 0.00 to 0.50% and having a balance of Fe and impurities and
having a thickness of 5.00 μm or more and 50.00 μm or less,
and wherein,
an amount of warpage is 5.0 mm or less, wherein the amount of warpage is determined by
etching a sample of the metal mask material of a square shape of 100 mm sides from one surface until the thickness of the sample becomes ⅖ and placing the etched sample on a surface plate, then measuring a maximum value in amounts by which four corners of the sample were lifted up.

2. The metal mask material according to claim 1 further containing, by mass %, C: 0.05% or less and Ca: 0.0005% or less.

3. The metal mask material according to claim 1, wherein the impurities are limited to Si: 0.30% or less, Mn: 0.70% or less, Al: 0.01% or less, Mg: 0.0005% or less, P: 0.030% or less, and S: 0.015% or less.

4. The metal mask material according to claim 1, wherein an average {111} lattice spacing from 1.45 μm to 7.11 μm below a surface of the metal mask material satisfies the following formula (1-1) and formula (1-2):

$$\Delta D \leq 0.00030 \quad (1\text{-}1)$$

$$\Delta D = |D_M - D_L| \quad (1\text{-}2)$$

where, the definitions of $D_M$ and $D_L$ in the above formulas are as follows:

$D_M$: average {111} lattice spacing (units: nm) obtained by grazing incidence X-ray diffraction technique;

$D_L$: reference value of {111} lattice spacing (units: nm) or average {111} lattice spacing (units: nm) calculated from a lattice constant of bulk.

5. The metal mask material according to claim 4, wherein a thickness of an oxide film measured by Auger electron spectrometry is 4.5 nm or less.

6. The metal mask material according to claim 4, wherein a 0.2% yield strength is 330 MPa or more and 850 MPa or less.

7. The metal mask material according to claim 4, wherein an average arithmetic surface roughness Ra of a direction perpendicular to the rolling direction is 0.02 μm or more and 0.10 μm or less.

8. The metal mask material according to claim 1, wherein the following formula (2-1) is satisfied, $$X(H_{w111}, t) = H_{w111} / \sqrt{t/25} \leq 0.545 \quad (2\text{-}1)$$

where, in the formula, $H_{w111}$ is an average FWHM of the {111} plane from 1.45 μm to 7.11 μm below the surface obtained by the grazing incidence X-ray diffraction technique and "t" is a thickness of the metal mask material (μm).

9. The metal mask material according to claim 1, wherein either of the following formula (3-1) or formula (3-2) is satisfied, $$r_{max} < 9.5 \quad (3\text{-}1)$$

$$r_{max} \geq 20 \quad (3\text{-}2)$$

$$r = I_{111}/I_{200} \quad (3\text{-}3)$$

where, $I_{111}$ is an integrated intensity of the {111} plane from 1.45 μm to 7.11 μm below the surface obtained by the grazing incidence X-ray diffraction technique;

$I_{200}$ is an integrated intensity of the {200} plane from 1.45 μm to 7.11 μm below the surface obtained by the grazing incidence X-ray diffraction technique;

$r_{max}$ is a maximum value of a ratio of integrated intensities defined by the formula (3-3).

10. The metal mask material according to claim 1, wherein the following formula (4-1) to formula (4-3) are satisfied:

$$0.385 \leq I_{200}/\{I_{111}+I_{200}+I_{220}I_{311}\} \quad (4\text{-}1)$$

$$I_{311}/\{I_{111}+I_{200}+I_{220}+I_{311}\} \geq 0.08 \quad (4\text{-}2)$$

$$0.93 \leq \{I_{220}+I_{200}\}/\{I_{111}+I_{200}+I_{220}+I_{311}\} \quad (4\text{-}3)$$

where, in the formulas, $I_{200}$ is the diffraction intensity of the {200} plane obtained by the focusing method, $I_{111}$ is the diffraction intensity of the {111} plane, $I_{220}$ is the diffraction intensity of the {220} plane, and $I_{311}$ is the diffraction intensity of the {311} plane.

11. The metal mask material according to claim 1, wherein an error calculated when measuring a residual stress using an X-ray stress measurement technique satisfies the following formula (5-1), $$\sigma \leq \alpha + \beta \times R + \gamma \times R^2 \quad (5\text{-}1)$$

where, $\alpha=211.1$; $\beta=5.355$; $\gamma=0.034886$; R in the above formula is the value of the residual stress analyzed using X-ray stress measurement technique method, and σ is the error analyzed when measuring the residual stress using the X-ray stress measurement technique.

12. The metal mask material according to claim 1, wherein when measuring stress using the X-ray stress measurement technique, the relationship between an angle (Ψ (deg)) formed by a plane normal of the metal mask material and the {220} plane and a diffraction peak position of the {220} plane (2θ (deg)) is expressed by the following formula (6-5) and coefficients "b", "c", "d", and "e" of the formula (6-5) satisfy the following formula (6-1) to formula (6-4), $$b/I \leq 0.09 \quad (6\text{-}1)$$

$$0.02 \leq |c| \quad (6\text{-}2)$$

$$d/I \leq 12 \quad (6\text{-}3)$$

$$2 \geq |e|/I \quad (6\text{-}4)$$

$$2\theta = a + b \times \sin^2\Psi + c \times \sin(d \times \sin^2\Psi + e) \quad (6\text{-}5)$$

where, $I=(z \times t^3)/12$
t: thickness (μm)
z: 0.000768.

13. A method for manufacturing a metal mask material according to claim 1, comprising
a process of melting an alloy having a composition of said metal mask material,
a process of obtaining a slab from the melted alloy,
a coiling process of hot rolling and coiling the slab to obtain hot rolled coil,
a process of alternately cold rolling and annealing the hot rolled coil at least once each after the coiling process to obtain steel foil of a thickness of 5.00 to 50.00 μm, and
a tension annealing process,
the tension annealing process being performed after a final rolling process, a rolling reduction in the final rolling process being 30.0% or more and 95.0% or less, and the tension annealing process being performed by an annealing temperature of 300 to 900° C. in a reducing atmosphere.

14. A metal mask using a metal mask material of claim 1.

* * * * *